United States Patent [19]

Hosack

[11] 4,063,992

[45] Dec. 20, 1977

[54] EDGE ETCH METHOD FOR PRODUCING NARROW OPENINGS TO THE SURFACE OF MATERIALS

[75] Inventor: Harold H. Hosack, Cupertino, Calif.

[73] Assignee: Fairchild Camera and Instrument Corporation, Mountain View, Calif.

[21] Appl. No.: 619,735

[22] Filed: Oct. 6, 1975

Related U.S. Application Data

[63] Continuation-in-part of Ser. No. 581,389, May 27, 1975, abandoned.

[51] Int. Cl.² ........................................... H01L 21/306
[52] U.S. Cl. ..................................... 156/653; 29/580; 156/657; 156/661; 156/662; 357/24
[58] Field of Search ............... 156/3, 11, 17, 650–657, 156/662, 661, 659; 148/187; 29/580; 357/24

[56] References Cited

U.S. PATENT DOCUMENTS

| | | | |
|---|---|---|---|
| 3,576,630 | 4/1971 | Yanagawa | 96/36 |
| 3,674,551 | 7/1972 | Athanas | 427/94 |
| 3,758,794 | 9/1973 | Kosonocky | 357/24 UX |
| 3,764,410 | 10/1973 | Hays | 148/187 |
| 3,920,861 | 11/1975 | Dean | 427/88 |

Primary Examiner—William A. Powell
Attorney, Agent, or Firm—Alan H. MacPherson; Henry K. Woodward; Norman E. Reitz

[57] ABSTRACT

An improved method and structure for producing narrow openings to the surface of a first material possessing a first set of etch characteristics is disclosed. The method includes the step of forming on a portion of the surface of the first material an etchable mask having a first narrow-opening-forming lateral edge disposed along a selected edge of the to-be-formed narrow opening. A protective layer of a second material possessing a second set of etch characteristics is next formed on the exposed surface of the first material, the protective layer having a second narrow-opening-forming lateral edge juxtaposed the first narrow-opening-forming lateral edge. The first narrow-opening-forming lateral edge on the mask is then etched to expose unprotected areas of the first material thereby producing the narrow opening to the surface of the first material. The method and structure of the invention is particularly well suited for producing fine geometry patterns in solid state device structures.

2 Claims, 69 Drawing Figures

EDGE ETCH METHOD FOR PRODUCING NARROW OPENINGS TO THE SURFACE OF MATERIALS

This application is a Continuation-in-Part of application Serial No. 581,389, filed May 27, 1975, now abandoned.

BACKGROUND OF THE INVENTION

1. Field of the Invention

This invention relates generally to a method and structure for producing narrow openings to the surfaces of materials, and, more particularly, relates to a method and structure which is well suited for manufacturing integrated-circuit semiconductor devices having fine geometry patterns.

2. Description of the Prior Art

Techniques for producing narrow openings to the surface of a material are known. One of the most popular techniques, which is widely used in the semiconductor industry, involves forming a layer of photoresist on the surface of a material, selectively exposing portions of the photoresist to ultraviolet light and developing the exposed photoresist. The widths of openings produced using this technique are limited by diffraction and reflection effects at the wavelengths of the radiation used to expose the photoresist. Narrower openings can be produced by analogous methods employing different photoresist materials and radiation of shorter wavelength such as an electron beam or X-rays. A thorough discussion of the limitations of conventional photolithography can be found in the July 1975 issue of the IEEE Transactions on Electron Devices.

Another technique used to produce a narrow emitter opening in a semiconductor device is disclosed in a paper titled "A New Sub-Micron Emitter Formation with Reduced Base Resistance for Ultra High-Speed Devices" by H. Kamioka et al, presented in December 1974 to the International Electron Devices Meeting held in Washington, D.C. and published starting on page 279 in the technical digest of that meeting. Kamioka et al's technique forms a three-micron-wide layered sandwich of silicon nitride, silicon dioxide and silicon nitride centered over the desired location of the emitter opening on the surface of a silicon substrate. The sandwiched layer of silicon dioxide is then laterally etched inward from both sides to form with the two nitride layers a structure with "I-beam" cross-sectional configuration. The vertical rib of remaining silicon dioxide protectively masks an underlying ribbon (stated to be 0.5 micron wide) of silicon nitride while the exposed portions of silicon nitride are etched away from both sides. The overlying masking silicon dioxide rib is subsequently removed and a layer of silicon dioxide is formed on the exposed surface of the silicon substrate. The remaining ribbon of silicon nitride, which defines both the width and location of the narrow emitter opening, is then removed, thereby exposing a portion of the silicon substrate surface.

The selective lateral etching of a small-area-bounding lateral edge on an adjacent overlying layer of one material to expose a larger area of the underlying material is shown in U.S. Pat. No. 3,783,047 issued to M. M. Paffen et al on Jan. 1, 1974 and titled "Method of Manufacturing a Semiconductor Device and Semiconductor Device Manufactured by Using Such a Method." The method taught by Paffen et al is used to produce a semiconductor device having a small zone with one selected set of electrical properties and a larger zone with another set of electrical properties.

The use of a selective lateral etch is described by C. N. Berglund et al in a paper entitled "Undercut Isolation A Technique for Closely Spaced and Self-Aligned Metalization Patterns for MOS Integrated Circuits." This paper was published in September, 1973 beginning on page 1255 of Vol. 120, No. 9 of the Journal of the Electrochemical Society. C. N. Berglund et al take advantage of the shadowing effect of an undercut area etched in a two-layer-insulator sandwich. Because of the masking effect of an undercut edge a thin metal film evaporated at an appropriate angle to the edge will be discontinuous at the undercut edges, resulting in electrically isolated metalization patterns at different vertical levels with negligible lateral spacing between them. Berglund et al illustrate an application for this technique by describing the design of a two-phase CCD (Charge-Coupled Device).

Although electron-beam and X-ray lithography techniques can be used to produce narrow openings which make possible smaller semiconductor elements and higher chip density than previously obtained using less advanced methods, these techniques have many disadvantages. Not only is the equipment required to practice the electron-beam technique presently very expensive, but the technique also presently requires prolonged photoresist exposure times which are unsuitable for mass production. Optimized equipment required to practice X-ray lithography on a production scale is not currently available. Moreover, in addition to the well-known hazards and fail-safe precautionary measures associated with the use of X-rays, the technique requires a high precision mask often made of heavy metal, such as gold, possessing geometries as fine as those to be produced on the surface of the material. Such masks are generally produced with electron-beam techniques and are both expensive and difficult to produce.

The width of narrow openings producible with the doublesided etch method of Kamioka et al is limited by the fact that the silicon dioxide rib must be sufficiently wide to support the overhanging layer of silicon nitride. Additionally, although the lateral etch rate of silicon dioxide is in theory controllable to render the depth of undercut a function of etch time, as the depth of undercut is increased to produce an ever-narrower silicon dioxide rib, the difficulty in controlling etch rate, etch uniformity and hence the width of the to-be-formed opening increases. Further, as the etch process occurs simultaneously from two sides, the uncertainty in the width of the to-be-formed opening increases due to the combined uncertainty in the locations of the converging edges at any given time.

SUMMARY OF THE INVENTION

This invention, in contrast to Kamioka et al's technique, achieves narrower openings by reducing rather than increasing the lateral etch time and by etching only one, rather than two, lateral edges of a masking material to produce each narrow opening. Therefore, the present invention is not structurally limited as is the Kamioka et al technique in the narrowness of openings it can be used to produce. Moreover, since a shorter etch time is required for a narrower to-be-formed opening, the non-uniformities in the width of the to-be-formed opening due to local variations in the etch rate tend to be reduced. In addition, since a narrow opening is produced at each edge of a masking material by the present invention, the density of narrow openings is increased over the Kamioka et at technique. Thus, the process of this invention overcomes many of the difficulties associated with prior-art methods used to produce narrow openings to the surface of a material. It does so by providing a novel method that is particularly attractive to the semiconductor industry in that it may be practiced with only materials and processes that are commonly used and well understood in that industry. This is in direct contrast to the more esoteric prior-art methods of electron-beam and X-ray lithography which have been used to produce similar narrow openings to the surface of a material.

In accordance with this invention, a process for producing a narrow opening to the surface of a first material possessing a first set of etch characteristics is provided which comprises the steps of forming on a portion of the surface of the first material an etchable mask having a first narrow-opening-forming lateral edge disposed along a selected edge of the to-be-formed narrow opening, forming a protective layer of a second material possessing a second set of etch characteristics on the exposed surface of the first material, the protective layer having a second narrow-opening forming lateral edge juxtaposed the first narrow-opening-forming lateral edge, etching the first narrow-opening-forming lateral edge on the mask to expose unprotected areas of the first material thereby producing a narrow opening to the surface of the first material.

Further, a structure for use in producing a narrow opening to the surface of a first material possessing a first set of etch characteristics is provided which comprises an etchable mask formed on a portion of the surface of the first material, the mask having a first narrow-opening-forming lateral edge disposed along a selected edge of the to-be-formed narrow opening and a protective layer of a second material possessing a second set of etch characteristics formed on the exposed portion of the surface of the first material, the protective layer having a second narrow-opening-forming lateral edge juxtaposed the first narrow-opening-forming lateral edge, whereby the first narrow-opening-forming lateral edge is etchable to expose unprotected areas of the first material thereby producing the narrow opening to the surface of the first material.

BRIEF DESCRIPTION OF THE DRAWINGS

The many objects and advantages of the present invention will become apparent to those skilled in the art when the following description of the best mode contemplated for practicing the invention is read in conjunction with the accompanying drawings, wherein like reference characters refer to the same or similar elements, and in which:

FIGS. 21a through 21j are stylized partial cross-sectional views of structures used to produce narrow lateral oxidized isolation regions in a polysilicon layer using the edge etch technique of the invention;

DETAILED DESCRIPTION

Figure 1:
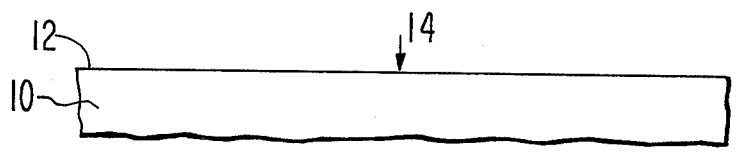
FIGS. 1 through 15 are stylized partial cross-sectional views of starting, intermediate and final structures employed in the practice of the invention.
Figure 2:
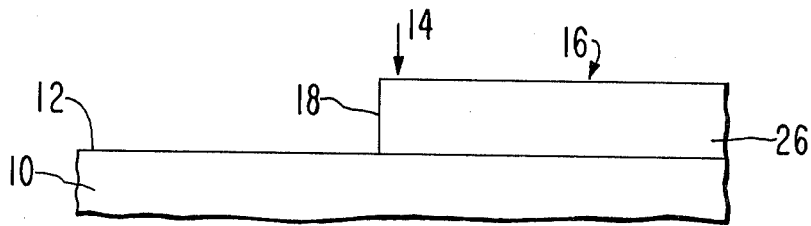
Figure 3:
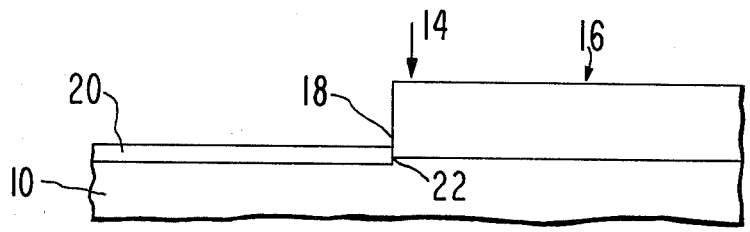
Figure 4:
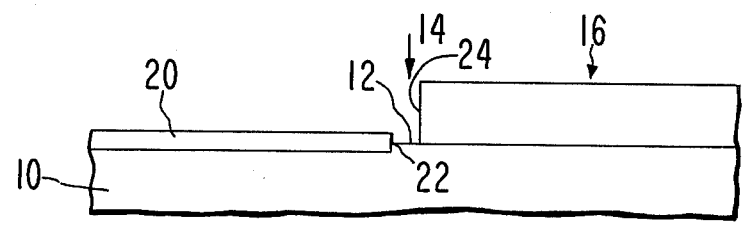

The invention provides a generalized method and structure for providing a narrow opening through an overlying material or materials to the surface of a first material. An understanding of this method and structure will be achieved by reference first to FIG. 1 which is a partial cross-sectional view of such a first material 10. The first material 10 possesses a first set of etch characteristics and a substantially planar surface 12. In order to form a narrow opening to the surface 12 of the first material 10 at a selected location 14, an etchable mask 16 is formed in a selected pattern on a portion of the surface 12 of the first material 10 as shown in FIG. 2. The etchable mask 16 possesses a first narrow-opening-forming lateral edge 18. The lateral edge 18 is shown throughout the several figures disposed substantially perpendicular to the surface 12 of the first material 10. However, it is to be understood that throughout this application whenever reference is made to a "lateral edge" such an edge may be disposed perpendicularly or at an angle to the surface 12 and further that such a "lateral edge" can be straight, or concave, or convex, or some compound combination thereof. Next, a protective layer of a second material 20 possessing a second set of etch characteristics is formed on the exposed surface 12 of the first material 10. The protective layer of second material 20 possesses a second narrow-opening-forming lateral edge 22 juxtaposed the first narrow-opening-forming lateral edge 18 as is shown in FIG. 3. Lastly, the first narrow-opening-forming lateral edge 18 on the etchable mask 16 is etched a selected distance away from the second narrow-opening-forming lateral edge 22 to form a resultant narrow-opening-forming lateral edge 24 thereby producing the desired narrow opening to the surface 12 of the first material 10 at the selected location 14 as shown in FIG. 4.

In the most elementary configuration of this invention the etchable mask 16 comprises a single region-defining layer 26 of a third material possessing a third set of etch characteristics. When the first narrow-opening-forming lateral edge 18 is etched back to form the resultant lateral edge 24, the upper surface of the etchable mask 16 is simultaneously etched away. This is acceptable so long as after the desired narrow opening has been formed at the selected location 14 there remains a sufficient amount of the etchable mask 16 to protect that portion of the surface 12 which is to remain unexposed.

Figure 5:
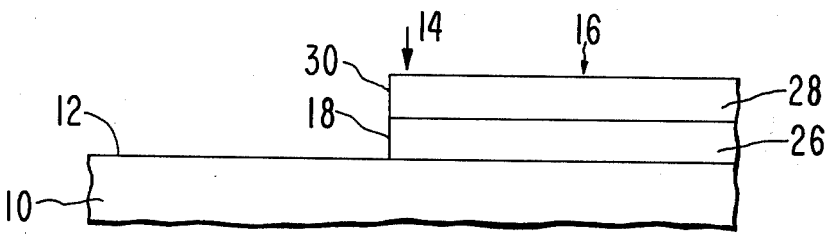
Figure 6:
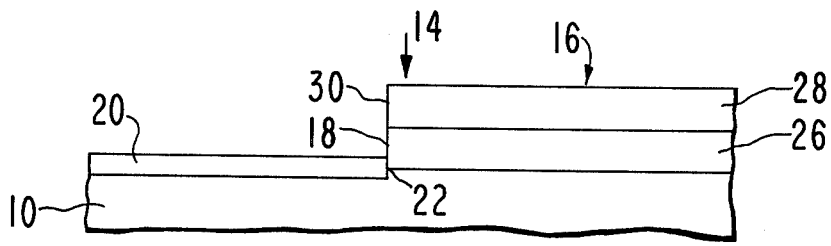
Figure 7:
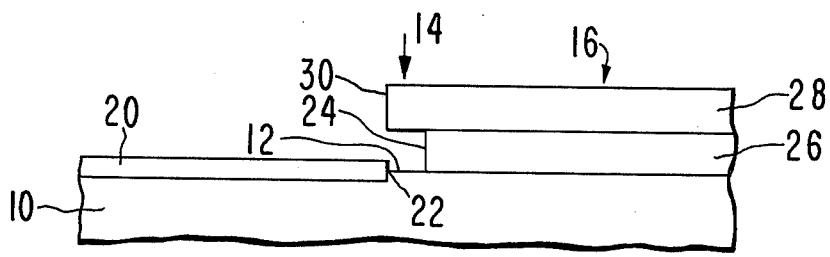
Figure 8:
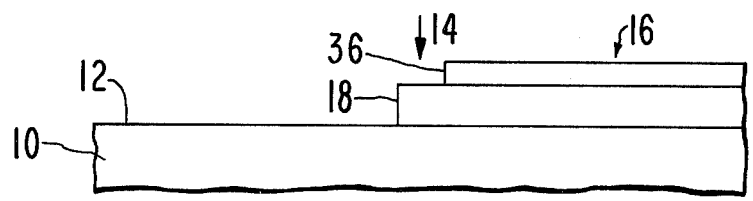
Figure 9:
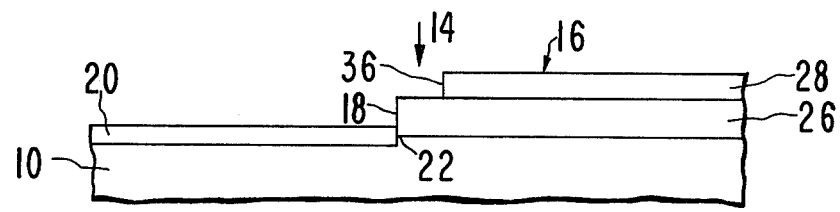
Figure 10:
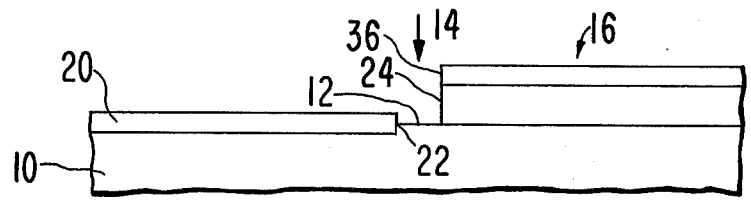

To obtain more control of the lateral etching of the first narrow-opening-forming lateral edge 18 and to reduce the required thickness of the region-defining layer 26 of third material, a layer of fourth material 28 possessing a fourth set of etch characteristics can be provided. The layer of fourth material 28 is adherently disposed in overlying registration with the third material 26 on its upper surface as shown in FIG. 5. The layer of fourth material 28 possesses a lateral edge 30 which is disposed above and along the first narrow-opening-forming lateral edge 18. The particular arrangement of materials shown in FIG. 5 can be provided by several techniques well known to those versed in semiconductor manufacturing technology. For example, successive depositions can be made of the third and fourth materials with a shadow mask protectively covering that portion of the surface 12 of the first material 10 on which a layered region is not desired. Another method of forming the structure shown in FIG. 5 is by deposition of uniform layers of third and fourth materials on the surface 12 of the first material 10 followed by photolithographic definition and etching steps common to the semiconductor industry. As is shown in FIG. 6, the protective layer of second material 20 can then be formed on the exposed portions of the surface 12 and the first narrow-opening-forming lateral edge 18 selectively etched away to form the resultant lateral edge 24 producing the desired narrow opening to the surface 12 of the first material 10 at the selected location 14 as shown in FIG. 7. Alternatively, the lateral edge 30 on the layer of fourth material 28 as shown in FIG. 5, can be selectively etched to form a third narrow-opening-forming lateral edge 36 as is shown in FIGS. 8 and 9. It will be understood that the selective etching of the lateral edge 30 on layer of fourth material 28 can occur prior or subsequent to the formation of the protective layer 20 on the exposed surface 12 of the first material 10. In either case, the structure shown in FIG. 9 results and the exposed portions of the layer of third material 26 are then etched away forming the desired narrow opening to the surface 12 of the first material 10 at the selected location 14 as is shown clearly in FIG. 10.

Figure 11:
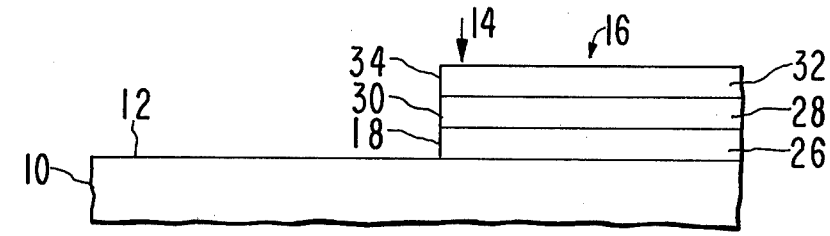
Figure 12:
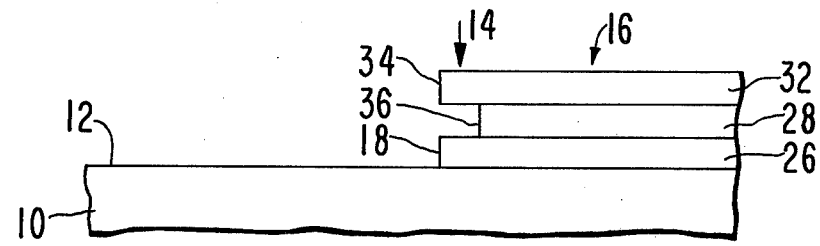
Figure 13:
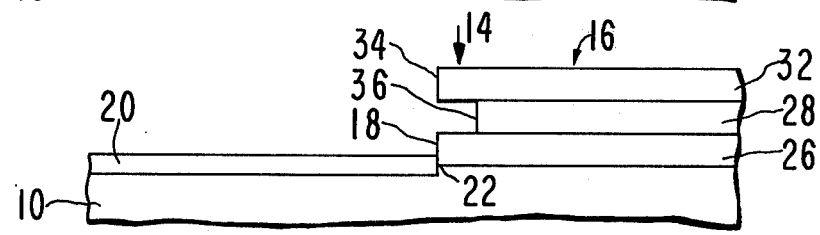
Figure 14:
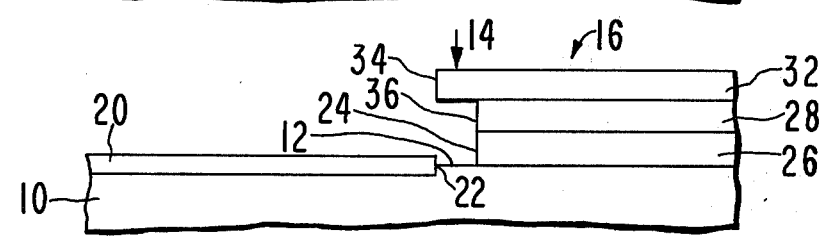
Figure 15:
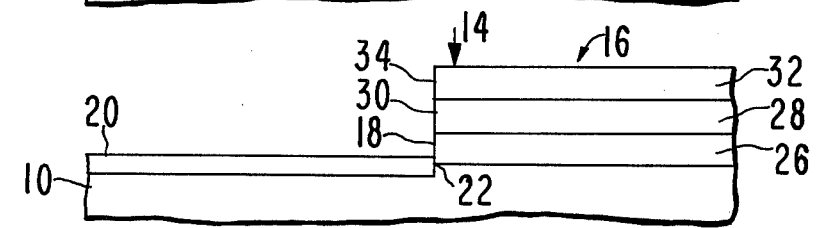

Greater control of the lateral etching of the lateral edge 30 on the layer of fourth material 28 to form the third narrow-opening-forming lateral edge 36 can be achieved through the use of a three layer etchable mask 16. Such a three layer mask is shown in FIG. 11 wherein the third layer comprises a layer of fifth material 32 possessing a fifth set of etch characteristics adherently disposed in overlying registration with the layer of fourth material 28 on its upper surface. The layer of fifth material 32 possesses a lateral edge 34 which is disposed above and along the lateral edge 30 on the layer of fourth material 28. The three layer etchable mask 16 shown in FIG. 11 can be provided by techniques analogous to those used to form the two layer mask shown in FIG. 5 and described above. After the structure in FIG. 11 has been formed, the lateral edge 30 on the layer 28 of fourth material is etched to form the third narrow-opening-forming lateral edge 36 as is shown in FIG. 12. The layer of fifth material 32 protectively covers the upper surface of the layer of fourth material 28 during at least a portion of the etch. Next, the protective layer of second material 20 is formed on the exposed surface 12 of the first material 10 as is shown in FIG. 13. Lastly, the portions of the layer of third material 26 exposed between the second and third narrow-opening-forming lateral edges, 22 and 36 respectively, are etched away forming the desired narrow-opening to the surface 12 of the first material 10 at the selected location 14 as is clearly shown in FIG. 14. Alternatively, as is shown in FIG. 15, the protective layer of second material 20 can be formed on the exposed surface 12 of the first material 10 before the edge 30 on the layer of fourth material 28 is etched.

It is to be understood that when the method of the invention is practiced with a single layer etchable mask 16 the structures shown in the series of FIGS. 1, 2, 3, and 4 are formed sequentially. Similarly, when a two layer etchable mask 16 is used to practice the method of the invention, the structures shown in the series of FIGS. 1, 5, 6, and 7, or in the series of FIGS. 1, 5, 8, 9, and 10, or in the series of FIGS. 1, 5, 6, 9, and 10 are formed sequentially. In like manner, when a three layer etchable mask 16 is employed, the structures shown in the series of FIGS. 1, 11, 12, 13, and 14 or in the series of FIGS. 1, 11, 15, 13 and 14 are formed sequentially. Additionally, it is to be further understood that in a selected etch step it is possible that the physical or chemical processes selected to etch an exposed portion of one selected material to form a desired configuration of materials can also etch exposed portions of other materials. However, the various thicknesses and etch characteristics of all materials must be such that when the narrow opening to the surface 12 of the first material 10 at the selected location 14 is cleared, there remains some part of the protective layer of second material 20 and some part of the region defining layer of third material 26 in those areas not desired to be openings.

FIGS. 1 through 15 are intentionally shown in stylized form without cross-sectional cross-hatching suggestive of specific materials. These figures are so rendered in an effort to emphasize the broad scope of the process and structure of the invention. Specific examples of portions of useful articles of manufacture which embody and serve to further illustrate the process and structure of the invention using specific selected materials are provided hereinbelow. For detailed information concerning individual process steps which are recited in the examples below the reader is directed to numerous patents, papers and books in the semiconductor arts of which the text by A. S. Grove entitled: PHYSICS AND TECHNOLOGY OF SEMICONDUCTOR DEVICES, published by John Wiley and Sons, Inc., N.Y., N.Y. 1967; and the text by L. I. Maissel and R. Glangentitled: HANDBOOK OF THIN FILM TECHNOLOGY, published by McGraw-Hill Book Co., N.Y., N.Y. 1970, are illustrative.

CHARGE COUPLED DEVICES

W. S. Boyle and G. E. Smith described the basic concept of charge coupled semiconductor devices in an article published in the Apr. 19, 1970 Bell System Technical Journal, page 587, entitled "Charge-Coupled Semiconductor Devices". Such devices consist of a metal-insulator-semiconductor structure in which minority carriers are stored in "spatially defined depletion regions", also called "potential wells", at the surface of the semiconductor material. Such devices are useful not only as shift registers and delay lines but are also useful as imaging devices possessing dynamic range and/or sensitivity characteristics that depend upon the physical features of the metal-insulator-semiconductor structure.

A method of producing such spatially defined depletion regions with appropriate properties was first described by Amelio et al, in an article entitled "Experimental Verification of the Charge Coupled Device Concept", published in the Apr. 19, 1970 Bell System Technical Journal, page 593.

Figure 16:
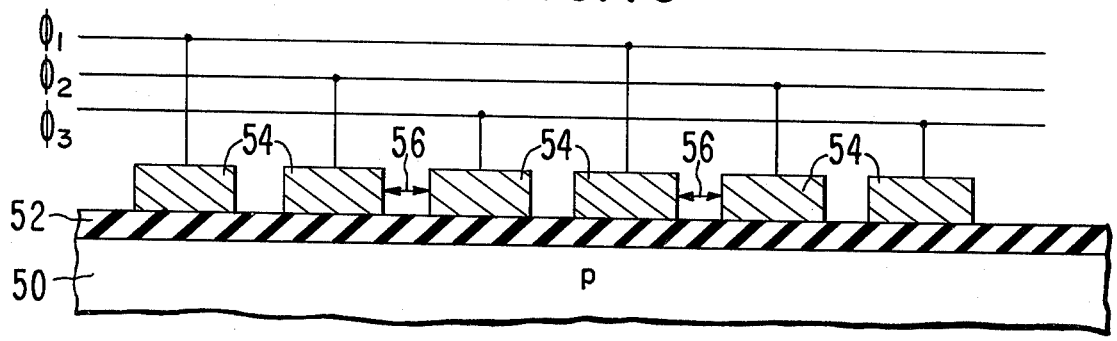
FIG. 16 is a stylized partial cross-sectional view of a three-phase charge-coupled device.

A CCD structure as described therein is formed with a series of Metal-Oxide-Semiconductor (MOS) capacitors separated by non-conducting gaps as shown in FIG. 16. This structure comprises a monocyrstalline silicon semiconductor substrate 50 of p type conductivity. An insulating layer of silicon dioxide 52 is formed on the upper surface of the substrate 50 and a plurality of aluminum electrodes 54 are disposed longitudinally on the layer 52 in spaced apart relationship a selected gap distance 56 from one another. These first CCD structures were of three-phase design. In such a design the potential wells are defined by the lateral extremities of the electrodes 54. Charge is transferred along the device structure by providing a different selected clock voltage signal $\phi_1$, $\phi_2$ and $\phi_3$ to each of three sets of electrodes formed by the electrical interconnection of every third electrode as shown. In these first devices the reported gap dimension 56 was 3 microns. Subsequent investigations showed that poor transfer efficiency and unstable performance in this type of device could be attributed to the uncontrolled surface potential in the gap region between the conducting electrodes.

Figure 17:
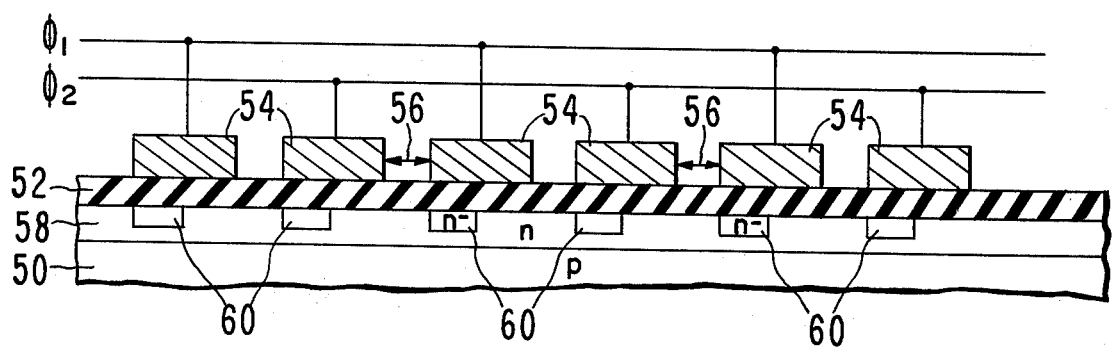
FIG. 17 is a stylized partial cross-sectional view of a two-phase buried channel, implanted barrier charge-coupled device.

Another CCD design is the two-phase, buried channel, implanted barrier structure shown in FIG. 17. In this design a buried channel region 58 of $n$ type conductivity is disposed in the surface of the substrate 50. Barrier regions 60 of $n$-type conductivity are periodically disposed in the surface of the substrate to define the lateral extremities of the potential wells. These barrier regions also function to effect the unidirectional flow of signal charge. The buried channel region 58 and barrier regions 60 can be formed with well-known ion implantation techniques. In the device configuration shown in FIG. 17, charge is transferred from left to right by providing two selected clock voltage signals $\phi_1$, and $\phi_2$ to the two series of alternate electrodes as shown. Subsequent investigations showed that poor transfer efficiency in this type of device could be attributed to errors in the alignment of the implanted barrier regions 60 with respect to the corresponding electrodes 54, as well as to the uncontrolled surface potential in the gap between the electrodes 54. FIG. 17 shows the desired alignment between the electrodes 54 and the barrier regions 60 for left to right charge transfer.

A partial solution to the uncontrolled surface potential problem can be achieved by making the semiconductor region beneath the gap formed between the electrodes 54 highly conductive. Such structures have been referred to as C$^4$D devices (Conductively Coupled Charge Coupled Devices). This solution has the primary disadvantage of storing only minimal charge in the highly conductive regions, and therefore not being attractive for high-density device applications. A more attractive solution to the uncontrolled surface potential problem is achieved by making the inter-electrode gap as narrow as possible. If the gap width 56 is reduced to submicron dimensions, it has been found that, for conventional device parameters, the effects of adjacent electrodes effectively control the gap potential, even though the surface of the gap itself is not covered by an electrode. Although using submicron gaps is a possible solution, the fabrication of devices with such small geometries on a planar surface has heretofore not been economically acceptable to the solid-state electronics industry. It is possible to produce these small gap widths by using electron-beam lithography, X-ray lithography, or shadowing techniques; however, these methods suffer from the drawbacks of requiring equipment and processes not commonly used or readily available in the solid-state electronics industry.

Figure 18:
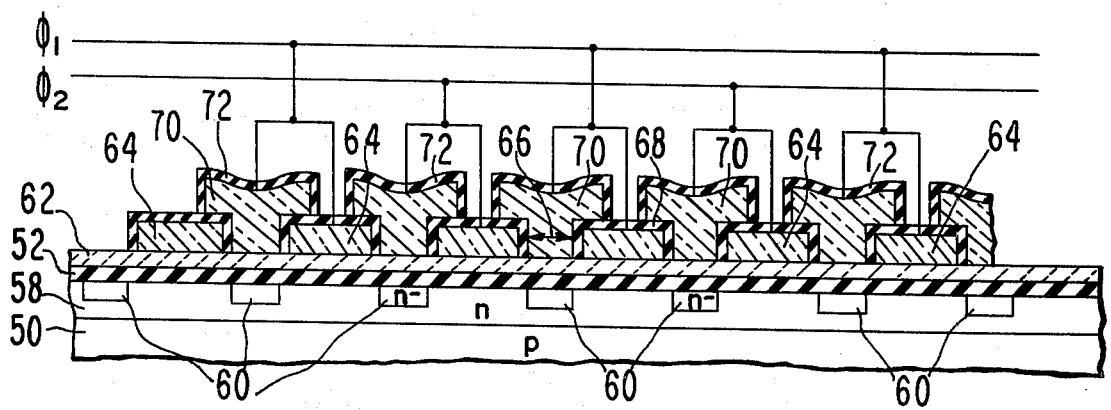
FIG. 18 is a stylized partial cross-sectional view of a two-phase, buried channel, implanted barrier charge-coupled device utilizing two overlapping levels of electrodes.

Various designs have been proposed to ensure that the barrier regions 60 in a two-phase, buried-channel, implanted-barrier CCD structure align with the corresponding electrodes 54. Of the designs available, the most widely accepted is shown in FIG. 18 and used two overlapping levels of electrodes 64 and 70. The electrodes are formed from polycrystalline silicon which has been highly doped with appropriate impurities to render it conductive. To form the structure shown in FIG. 18, $n$ type impurities are introduced into the upper surface of the substrate 50 using ion implantation techniques to form the buried-channel region 58. An insulating layer of silicon dioxide 52 is then thermally grown on the upper surface of the substrate 50. An additional insulating layer 62 of silicon nitride is then formed on the upper surface of the insulating layer 52. The first layer of polysilicon electrodes 64 are then formed on the upper surface of the insulating silicon nitride layer 62 as shown. An insulating layer of silicon dioxide 68 is then thermally grown on the exposed surfaces of the polysilicon electrodes 64 leaving a first level inter-electrode gap 66. The first level of electrodes 64 are used as a mask during the ion implantation of $p$ type impurities to form the $n$-type barrier regions 60 aligned beneath the first level inter-electrode gaps 66. The second level of doped polysilicon electrodes 70 are then overlappingly formed as shown in the gaps 66 between the first level of electrodes 64. An insulating layer of silicon dioxide 72 is then thermally grown on the exposed surfaces of the second level of electrodes 70. Adjacent first and second level electrodes are then electrically connected as shown to form a series of composite electrodes which are alternately connected to a pair of selected clock voltage signals $\phi_1$ and $\phi_2$.

There are at least three disadvantages to the CCD design shown in FIG. 18. First, the second level of conductors 70 necessarily overlap a portion of the first level of conductors 64. In devices for optical imaging where the image is transmitted through the conductor layers, this overlap reduces the optical response of the device. Second, the minimum length of a device made with this structure is limited by the required alignment tolerance to ensure overlap of the edges of the two electrode levels 64 and 70, as well as by the minimum first level inter-electrode gap 66 which is commercially producible. For instance, with present technology, a two micron minimum alignment tolerance for each side of the second level of electrodes 70 is generally required, and a three micron first level inter-electrode gap 66 is a typical minimum width commercially producible. Therefore, the minimum cell size currently available (a "cell" in the two-phase structure comprises two barrier regions 60 and two potential well regions between the barrier regions) is 20 microns. A third disadvantage of the two level CCD structure shown in FIG. 18 is that each of the second level of electrodes 70 (barrier electrodes) must be externally connected to its associated adjacent first level electrode 64 (potential well electrode). This electrical connection is usually done on another part of the device structure, and generally requires more device area than would be required for structures wherein the barrier electrode and the potential well electrode are integral.

A more detailed discussion of charge coupled devices is given in an article entitled "Charge-Coupled Devices", by G. F. Amelio which appeared on page 22 in the February 1974 issue of Scientific American.

Two examples of charge-coupled device structures are provided which both embody and illustrate the edge etch technique of the present invention. In the first example, the edge etch technique is used to produce a two-phase implanted barrier CCD structure having a single level of electrodes in which the disadvantages of a wide gap between electrodes and possible implanted barrier region misalignment are eliminated. It will be shown that by the elimination of portions of this process, a single electrode level two-phase buried-channel implanted barrier structure may be produced in which the barrier electrode is separated from the potential well electrode by a narrow gap. It will also be shown that by elimination of further portions of the process a single level electrode, multi-phase CCD can be produced in which the electrodes are separated by narrow gaps.

In the second example, a process is described in which the edge etch technique of the invention is used to produce a two-phase implanted barrier CCD structure having a first and a second level of electrodes.

In this second example both the first level and second level inter-electrode gaps are produced with the edge etch technique. It will be shown that by the elimination of certain portions of this process, a multi-phase CCD having two levels of electrodes is produced.

EXAMPLE 1

Figure 19A:
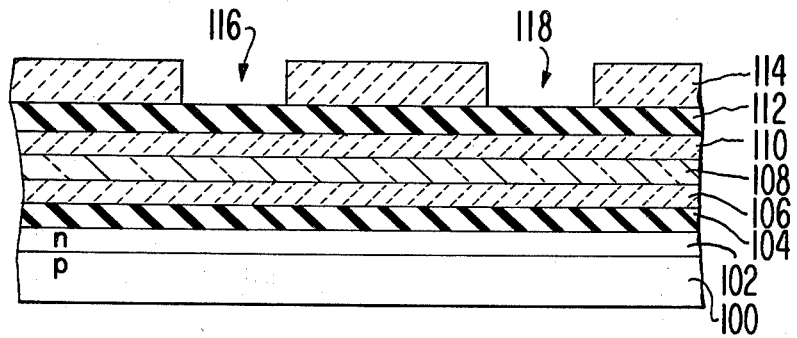
FIGS. 19a through 19j are stylized partial cross-sectional views of structures which illustrate the edge etch process of this invention used in the fabrication of a single level polysilicon electrode, buried channel, implanted barrier chargecoupled device in which the individual electrodes are separated by narrow gaps.

Referring now to FIG. 19a, a substrate 100 is shown in partial cross section and will be used as the starting material for this example. The substrate 100 comprises a wafer of monocrystalline silicon about 500 microns thick (although other thicknesses can also be used, if so desired) that has been boron-doped with approximately $5 \times 10^{14}$ impurity atoms per cubic centimeter, and hence is of $p$ type conductivity. Although this example uses a silicon semiconductor substrate, it will be evident to those skilled in the art that other semiconductor materials capable of being used to make a charge-coupled device can be used. Furthermore, it is to be understood that the regions of specified conductivity type described in the text and shown in the figures of this application can be of opposite type conductivity, if so desired, in order to provide a CCD structure using charge packets comprising the opposite type minority carrier.

An $n$ type region 102 is formed on the surface portion of the semiconductor substrate 100 using arsenic or phosphorous as the $n$ type dopant for that region. Devices employing this $n$ type layer are referred to in the literature as "buried-channel" charge-coupled devices. The operation and function of a buried-channel region such as region 102 is set forth in a paper by C. K. Kim, J. M. Early, and G. F. Amelio, entitled "Buried Channel Charge-Coupled Devices", presented at and published in the proceeding of the Northeast Electron. Res. Eng. Meet. (NEREM), Boston, Mass., Nov. 1-3, 1972.

In this example, the $n$ type region 102 has a thickness of about 0.5 microns and a phosphorous impurity level of approximately $3 \times 10^{16}$ atoms per cubic centimeter.

Next, the substrate 100 is coated with an appropriate insulating layer for CCD operation. In this example, the insulating layer comprises a two-layered structure of silicon nitride 106 over silicon dioxide 104. The layer of silicon dioxide 104 is grown on the upper surface of the substrate 100 using well-known thermal oxidation techniques and is approximately 800 Angstroms thick. The overlying layer of silicon nitride 106 is formed on the upper surface of the layer 104 using well-known chemical vapor deposition techniques and is approximately 900 Angstroms thick.

Next, a layer of electrically conductive material 108 (which will subsequently be subdivided using the edge etch technique of the invention to form a plurality of individual electrodes) is formed on the upper surface of the layer of silicon nitride 106. In this example, the layer 108 of polycrystalline silicon is formed using well-known chemical vapor deposition techniques. Layer 108 is highly doped with appropriate impurities to render it conductive and is approximately 4000 Angstroms thick.

Next, a layer 110 of silicon nitride approximately 400 Angstroms thick is formed on the upper surface of the doped polycrystalline silicon layer 108.

Next, a 7500 Angstrom thick layer 112 of silicon dioxide is formed on the upper surface of the layer of silicon nitride 110. The layer of silicon dioxide 112 is deposited by well-known chemical vapor deposition techniques and is hereinafter referred to as vapox to distinguish it from thermally grown silicon dioxide which is often referred to as thermox.

Next, a 1000 Angstrom thick layer 114 of silicon nitride is formed on the upper surface of the silicon dioxide layer 112. The layer of silicon nitride 114 is shown in FIG. 19a with a pair of apertures 116 and 118 which expose selected portions of the layer of vapox 112. The apertures 116 and 118 in the layer of silicon nitride 114 are formed by photolithographic definition and etching techniques common to the semiconductor industry. In this example, these apertures are approximately 5 microns wide and are disposed on 15 micron centers.

Figure 19B:
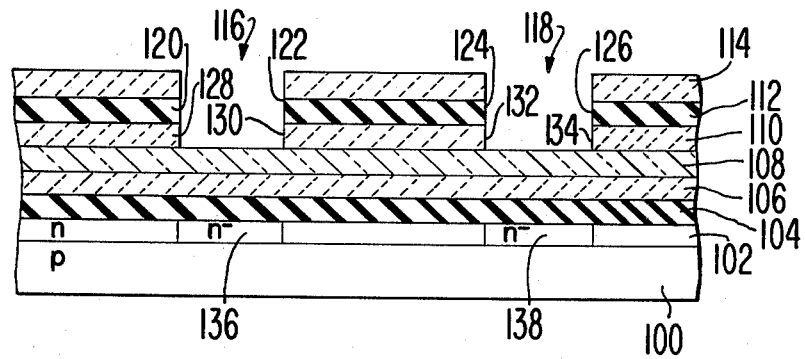

Referring now to FIG. 19b, portions of the vapox layer 112 and the silicon nitride layer 110 lying in registration beneath the apertures 116 and 118 have been removed. The exposed portions of the vapox layer 112 are etched away with a buffered hydrofluoric acid solution. Although other etchants can be successfully employed, one acceptable solution for etching silicon dioxide comprises: 473 ml of 49% hydrofluoric acid (electronic grade); and 2832 ml of 40% aqueous ammonium fluoride. At room temperature (22° C) this solution etches approximately 25 Angstroms per second of densified vapor deposited silicon dioxide (vapox) and approximately 17 Angstroms per second of thermally grown silicon dioxide (thermox). It will be understood by those skilled in the art that these typical etch rates are influenced by a variety of factors. Among these factors are the level of impurities in the material to be etched and the geometry and location of the exposed material. For example, when an etchant is used to remove material in a location where the flow of etchant is restricted, some local depletion of the etchant and local saturation of the solution with removed material can occur and hence the etch rate at the location of restricted flow can be somewhat slowed. The subsequently exposed portions of the silicon nitride layer 110 are etched away with hot phosphoric acid. When 85% phosphoric acid (electronic grade) is used at 155° C, approximately 50 Angstroms per minute of silicon nitride are etched. Care is taken to etch completely through the exposed portions of the silicon nitride layer 110 without completely etching the thicker silicon nitride layer 114. As a result of etching through the silicon dioxide layer 112, lateral edges 120, 122, 124 and 126 are formed. In like manner, etching through the silicon nitride layer 110 forms lateral edges 128, 130, 132 and 134.

Well-known ion implantation techniques are next used to form $n-$ regions 136 and 138 in the $n$ type region 102 in underlying registration with the apertures 116 and 118. The remaining portions of the layers 114, 112 and 110 function to protectively mask those portions of the $n$ type region 102 that are to remain unaffected by the ion implant. Since this ion implantation step is used to form $n-$ type regions in the existing $n$ type region 102, boron (or other desired $p$ type) ions are used to convert the selected portions of the $n$ type region 102 to $n$-type implanted barrier regions 136 and 138.

Figure 19C:
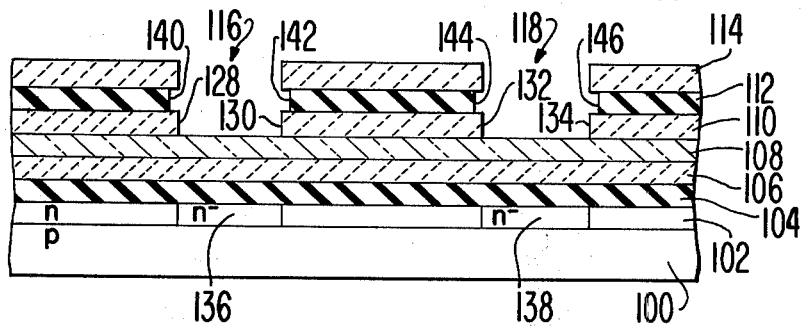

Referring now to FIG. 19c, the exposed lateral edges 120, 122, 124 and 126 on the layer 112 of silicon dioxide are etched a selected distance to form new lateral edges 140, 142, 144 and 146 as shown. In this example, the distance between lateral edges 120, 122, 124 and 126 the new lateral edges 140, 142, 144 and 146 respectively is approximately 0.5 microns.

Figure 19D:
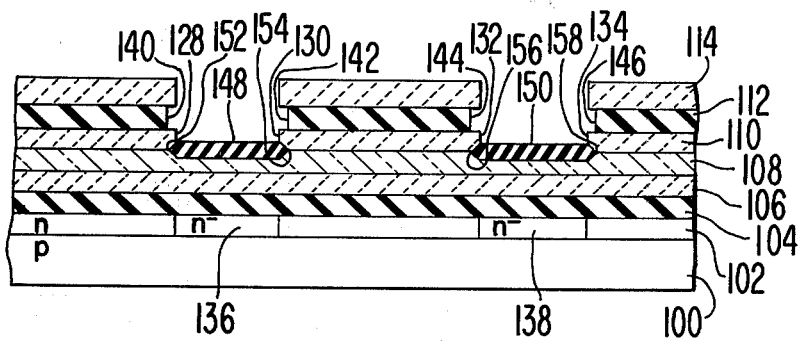

Next, as shown in FIG. 19d, the exposed portions of the electrically conductive layer 108 of highly doped polycrystalline silicon are thermally oxidized to form protective layers 148 and 150 as shown. In this example, these layers of silicon dioxide 148 and 150 are grown to a thickness of approximately 1500 Angstroms. The layers 148 and 150 have lateral edges 152, 154, 156 and 158 which are juxtaposed lateral edges 128, 130 and lateral edges 132, 134 respectively. It is noted that silicon oxides can be thermally grown in ways well-known to those skilled in the art such that oxides do not form to any appreciable extent on silicon nitride. Accordingly, in this example, the growth of the thermox layers 148 and 150 does not preclude the selective etching of those portions of the layer 110 of silicon nitride exposed between the lateral edges 152, 154, 156 and 158 on the layers 148 and 150 and the lateral edges 140, 142, 144 and 146 on the layer 112 respectively.

Figure 19E:
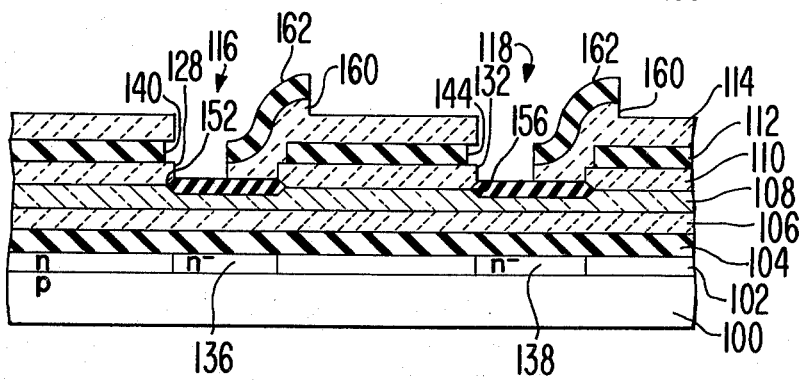

Referring now to FIG. 19e, conventional deposition, photolithographic definition and etching processes similar to those described above are employed to protectively cover one side of the apertures 116 and 118 substantially as shown. In this example, the protective covering comprises a 400 Angstrom thick layer 160 of silicon nitride covered with a 2000 Angstrom thick layer 162 of vapox.

Figure 19F:
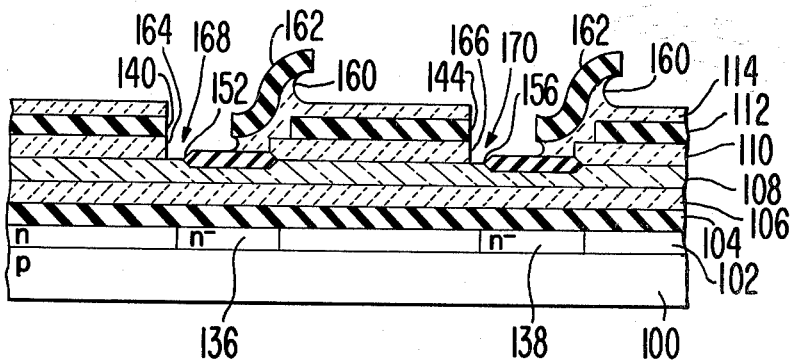

Thereafter, as is shown in FIG. 19f, the exposed lateral edges 128 and 132 on the layer 110 of silicon nitride are etched to form new lateral edges 164 and 166 respectively. The formation of these new lateral edges produces narrow openings 168 and 170 to the surface of the layer 108 of highly doped polycrystalline silicon. Although in this etch step a portion of the layers 114 and 160 are etched as shown, sufficient portions of layer 160 remain to protect the lateral edges 130 and 134 from etching. The narrow openings 168 and 170 are bounded by the pairs of lateral edges 164, 152 and 166, 156 respectively. The widths of the narrow openings 168 and 170 are controllable by the location of the lateral edges 140 and 144, and by the type, concentration, time and temperature of the silicon nitride etchant used. In this example, as mentioned above, the lateral edges 140 and 144 on the layer 112 of vapox have been laterally displaced by etching a distance of approximately 0.5 microns.

Figure 19G:
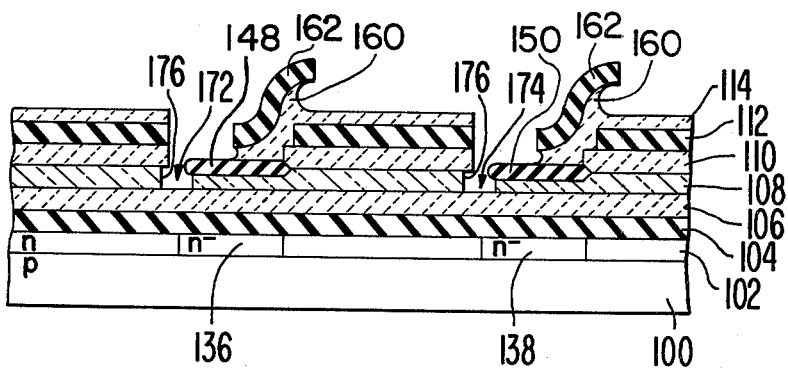

Next, as is shown in FIG. 19g, the exposed portions of the electrically conductive layer 108 of polycrystalline silicon lying beneath the narrow openings 168 and 170 are etched away exposing portions of the insulating layer 106 of silicon nitride. This etching step creates a plurality of electrodes 176 formed from remaining portions of the electrically conductive layer 108 of highly doped polycrystalline silicon which are electrically isolated from similar adjacent electrodes by inter-electrode gaps 172 and 174. It is to be understood that the exposed portions of polycrystalline silicon can be removed with either well-known liquid chemical etchants or a plasma etch. Although other etchants can be successfully employed, one acceptable solution for etching polycrystalline silicon comprises, by volume: 50 parts 70% nitric acid (electronic grade); 1 part 49% hydrofluoric acid (electronic grade); and 20 parts deionized water. At room temperature (22° C), this solution etches polycrystalline silicon at a rate of approximately 800 Angstroms per second. In this example, the width of the resulting inter-electrode gaps 172 and 174 is approximately 0.5 microns. As described above, in a two-phase CCD alternate electrodes 176 are electrically connected. This electrical interconnection can be accomplished by appropriately patterning and etching the layer 108, or by a subsequent interconnection.

Figure 19H:
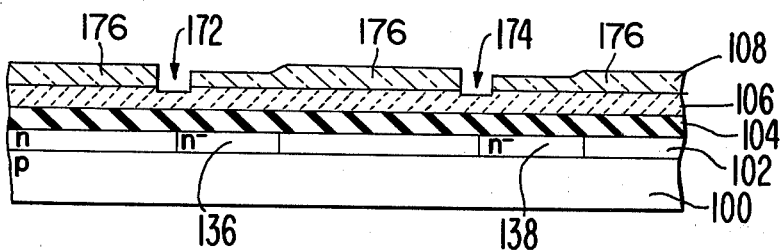

Thereafter, the remaining portions of layer 162, 160, 114, 112 and 110 together with the thermally oxidized regions 148 and 150 are removed, leaving the structure shown in FIG. 19h.

FIG. 19h shows a portion of the insulating layer 106 of silicon nitride lying in registration beneath the inter-electrode gaps 172 and 174 removed. The removal of a portion of the layer 106 follows as a natural consequence of removing the silicon nitride layers 160, 114, and 110. The thicknesses of the various layers of silicon nitride are selected such that the partial etching of the layer 106 does not adversely affect the operation of the CCD.

Figure 19I:
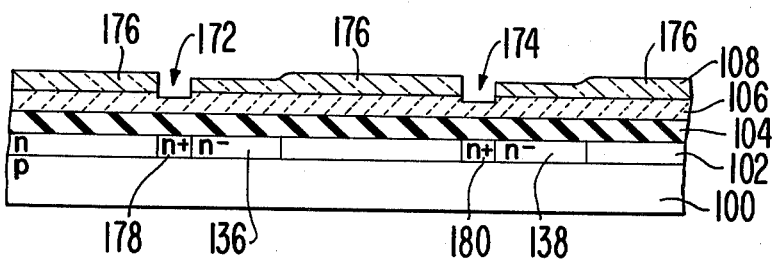

Referring now to FIG. 19i, the inter-electrode gaps 172 and 174 are used as windows through which $n$ type impurity atoms are introduced to form electrically conductive $n+$ regions 178 and 180 in the $n$ type region 102. In this example, well-known ion implantation techniques are used to introduce phosphorous impurity atoms through the insulating layers 106 and 104, while using the remaining portions of the layer 108 of polycrystalline silicon as a protective mask. It is to be understood that standard diffusion processes can also be used to form the $n+$ regions 178 and 180.

Figure 19J:
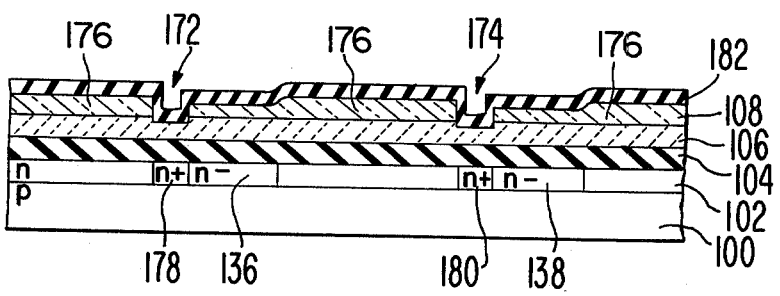

With reference now to FIG. 19j, a passivating layer 182 is formed to seal the surface of the electrodes 176 as well as the inter-electrode gaps 172 and 174. In this example, the passivating layer comprises approximately 2000 Angstroms of silicon dioxide (thermox) grown on the exposed surfaces of the layer 108 followed by the vapor deposition of approximately 5000 Angstroms of vapox.

The final structure shown in FIG. 19j formed by the process described above is a single-level-electrode, buried channel, implanted-barrier CCD. In this structure the electrodes are essentially planar and are separated by narrow gaps. Moreover, that portion of the buried channel region beneath the narrow gaps is highly conductive. Furthermore, each barrier electrode and its associated potential well electrode are formed from a single piece of conductive material. Lastly, the implanted barrier regions are essentially aligned with their corresponding electrodes.

Those skilled in the art of CCD structure and fabrication will understand that deletions of various portions of the processing steps described above can be made to produce devices with substantially different characteristics than those produced with the described process. In particular, the step used to produce the highly doped $n+$ regions 178 and 180 can be eliminated and will result in a two phase implanted-barrier CCD in which the control of the potential beneath the inter-electrode gaps 172 and 174 is achieved solely by the minimized widths of these gaps. Moreover, the steps used to form the silicon nitride layer 160 and the vapox layer 162 which protectively cover one side of the apertures 116 and 118 as shown in FIG. 19e can be deleted. Such deletion will produce a CCD in which the barrier electrodes are separated by narrow gaps from the potential well electrodes. In such a device, two-phase operation is obtained by electrically connecting adjacent barrier and potential well electrodes. This connection may be accomplished permanently as part of the device structure. Alternatively, the electrodes can be selectively connectable so that the device can be made to transfer charge left or right, depending upon the order of the connection of the barrier and potential well electrodes. Elimination of the step used to form the $n$ type buried channel region 102 will result in a surface-channel CCD. Additionally, the elimination of the steps used to form the $n-$ type implanted barrier regions 136 and 138 will result in the fabrication of a multi-phase CCD.

Referring again to FIG. 19g, it is not necessary to completely etch the exposed portions of the polycrystalline silicon layer 108 to form electrically isolating inter-electrode gaps 172 and 174. In the example given above where the electrically conductive layer 108 of highly doped polycrystalline silicon was approximately 4000 Angstroms thick, etching only 3000 Angstroms of this layer followed by the thermal growth of a passivation layer 182 of thermox approximately 2000 Angstroms thick will convert all of the unetched polycrystalline silicon in the inter-electrode gaps 172 and 174 to nonconductive silicon dioxide. This nonconductive material will serve to electrically isolate the adjacent electrodes.

Greater control over the potential in the semiconductor regions lying in registration beneath the narrow inter-electrode gaps 172 and 174 can be achieved by the deposition of a layer of electrically conductive material (not shown) on the upper surface of the passivating layer 182 of silicon dioxide. Such a layer of electrically conductive material can be electrostatically biased to provide absolute control over the potential in regions beneath the inter-electrode gaps 172 and 174. The application of such an overlying conductive layer does not affect the planarity of the CCD surface. If the CCD is not to be used as an imaging device, the remaining portions of the layers 162, 160, 114, 112, 110, 148 and 150 as shown in FIG. 19g need not be removed as these layers do not detrimentally affect the electrical performance of devices produced with this process.

EXAMPLE 2

Figure 20A:
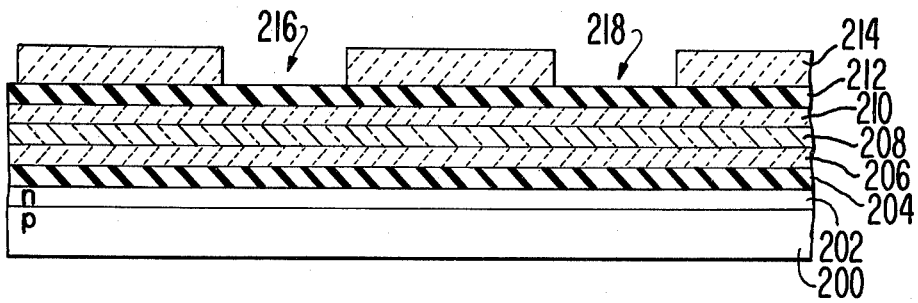
FIGS. 20a through 20p are stylized partial cross-sectional views of structures used in the fabrication of a two-phased buried channel, implanted barrier charge-coupled device having two overlapping levels of electrodes in which the narrow gaps between individual electrodes on both levels are produced with the edge etch technique of the invention.

Referring now to FIG. 20a a substrate 200 is shown in partial cross-section and will be used as the starting material for this example. The substrate 200 comprises a wafer of monocrystalline silicon about 500 microns thick that has been boron doped with approximately $5 \times 10^{14}$ impurity atoms per cubic centimeter, and hence is of $p$ type conductivity. Although this example uses a 500 micron thick silicon semiconductor substrate, it will be evident to those skilled in the art that other semiconductor materials of appropriate thicknesses in which charge coupled devices can be formed may be used. Furthermore, it is to be understood that the regions of specified conductivity type described in the text and shown in the figures of this example can be of opposite type conductivity, if so desired, to provide a minimum geometry overlapping gate CCD structure using charge packets comprising the opposite type minority carrier.

An $n$ type region 202 is formed on a portion of the surface of the semiconductor substrate 200 using arsenic or phosphorous as the $n$ type dopant for that region. Devices employing this $n$ type layer are referred to in the literature as "Buried Channel" charge-coupled devices. In this example, the $n$ type region 202 has a thickness of about 0.5 microns and a phosphorous impurity level of approximately $3 \times 10^{16}$ atoms per cubic centimeter.

Next, the substrate 200 is coated with an appropriate insulating layer for CCD operation. In this example, the insulating layer comprises a two-layered structure of silicon nitride 206 over silicon dioxide 204. The layer of silicon dioxide 204 is grown on the upper surface of the substrate 200 using well-known thermal oxidation techniques and is approximately 800 Angstroms thick. The overlying layer of silicon nitride 206 is formed on the upper surface of the layer 204 using equally well-known chemical vapor deposition techniques and is approximately 900 Angstroms thick.

Next, a layer of electrically conductive material 208 (which will subsequently be subdivided using the edge etch technique of the invention to form a plurality of individual first-level electrodes also referred to as potential-well electrodes) is formed on the upper surface of the layer of silicon nitride 206. In this example, the layer 208 is formed from polycrystalline silicon which has been highly doped with phosphorous impurities to render it conductive and is approximately 4000 Angstroms thick.

Next, a layer 210 of silicon nitride approximately 400 Angstroms thick is formed on the upper surface of the doped polycrystalline silicon layer 208.

Next, a 7500 Angstrom thick layer 212 of silicon dioxide is formed on the upper surface of the layer of silicon nitride 210. The layer of silicon dioxide 212 (vapox) is deposited by well-known chemical vapor deposition techniques.

Next, a 1000 Angstrom thick layer 214 of silicon nitride is formed on the upper surface of the silicon dioxide layer 212. The layer of silicon nitride 214 is shown in FIG. 29 with a pair of apertures 216 and 218 which expose selected portions of the layer of vapox 212. The apertures 216 and 218 and the layer of silicon nitride 214 are formed by photolithographic definition and etching techniques common to the semiconductor industry. In this example these apertures are approximately 3 microns wide and are disposed on 10 micron centers.

Figure 20B:
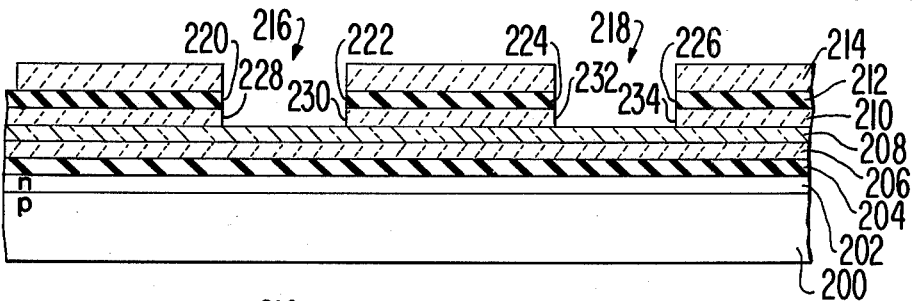

Referring now to FIG. 20b, portions of the vapox layer 212 and the silicon nitride layer 210 lying in registration beneath the apertures 216 and 218 have been removed. The exposed portions of the vapox layer 212 are etched away with a buffered hydrofluoric acid solution. The subsequently exposed portions of the silicon nitride layer 210 are etched away with hot phosphoric acid. The thickness of the layers 214 and 210 have been chosen such that it is possible to etch completely through the exposed portions of the silicon nitride layer 210 without completely etching the thicker silicon nitride layer 214. As a result of etching through the silicon dioxide layer 212, lateral edges 220, 222, 224, and 226 are formed. In like manner, etching through the silicon nitride layer 210 forms lateral edges 228, 230, 232 and 234.

Figure 20C:
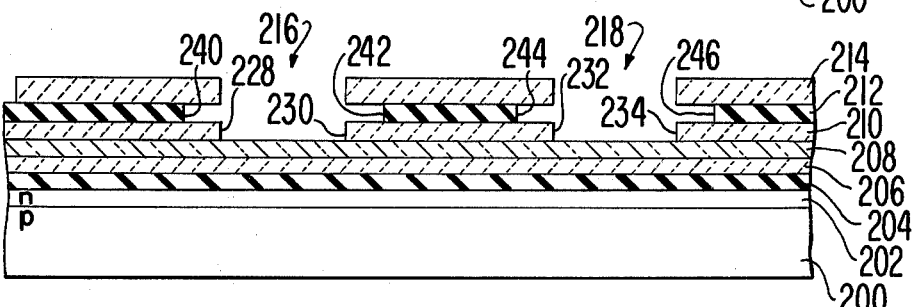

Referring now to FIG. 20c, the exposed lateral edges 220, 222, 224 and 226 on the layer 212 of silicon dioxide (vapox) are etched a selected distance to form new lateral edges 240, 242, 244 and 246 as shown. In this example, the distance between lateral edges 220, 222, 224 and 226 and new lateral edges 240, 242, 244 and 246 respectively is approximately 2.0 microns.

Figure 20D:
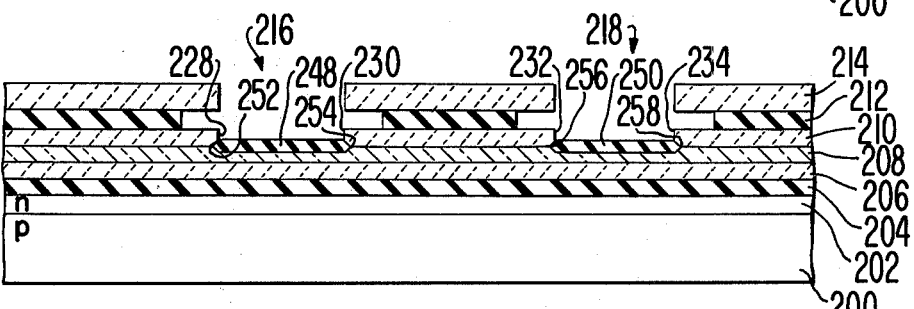

Next, as shown in FIG. 20d, the exposed portions of the electrically conductive layer 208 of highly doped polycrystalline silicon are thermally oxized to form protective layers 248 and 250. In this example, these layers of silicon dioxide 248 and 250 are grown to a thickness of approximately 1500 Angstroms. The layers 248 and 250 have lateral edges 252, 254, 256 and 258 which are juxtaposed lateral edges 228, 230 and lateral edges 232, 234 respectively. As noted above, the growth of the thermox layers 248 and 250 does not preclude the selective etching of those portions of the layer 210 of silicon nitride exposed between the lateral edges 252, 254, 256 and 258 on the layers 248 and 250 and the lateral edges 240, 242, 244 and 246 on the layer 212 respectively.

Figure 20E:
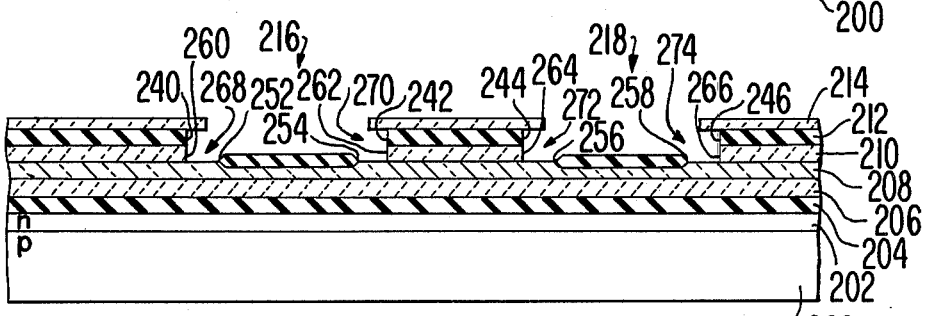

Thereafter, as is shown in FIG. 20e, the exposed lateral edges 228, 230, 232 and 234 on the layer 210 of silicon nitride are etched to form new lateral edges 260, 262, 264 and 266 respectively. The formation of these new lateral edges defines narrow openings 268, 270, 272 and 274 to the surface of the layer 208 of highly doped polycrystalline silicon. The narrow opening 268 is bounded by a pair of lateral edges 260 and 252 as shown. The other simultaneously formed narrow openings are bounded in like manner. The width of these narrow openings are controllable by the location of the lateral edges 240, 242, 244 and 246 and by the type, concentration, time and temperature of the silicon nitride etchant used. In this example, as mentioned above, the lateral edges 240, 242, 244 and 246 on the layer 212 of vapox have been laterally displaced by etching a distance of approximately 2.0 microns.

Figure 20F:
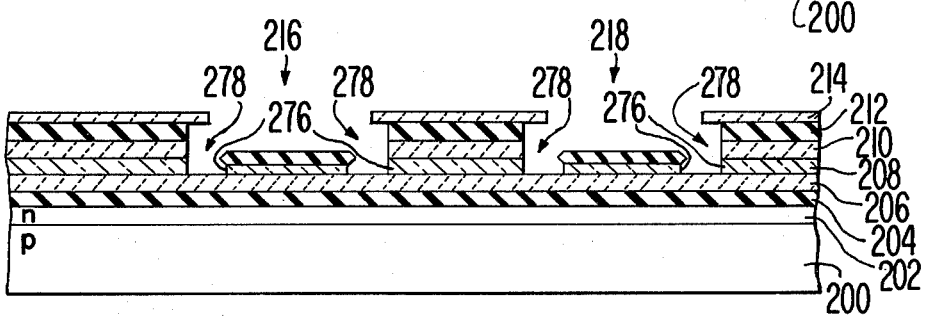

Next, as is shown in FIG. 20f, the exposed portions of the electrically conductive layer 208 of highly doped polycrystalline silicon lying beneath the narrow openings 268, 270, 272 and 274 are etched away exposing portions of the insulating layer 206 of silicon nitride. This etching step creates a plurality of first level potential well electrodes 276 formed from remaining portions of the electrically conductive layer 208 of highly doped polycrystalline silicon which are isolated from similar adjacent electrodes by a plurality of first level interelectrode gaps 278. It is to be understood that the exposed portions of layer 208 of polycrystalline silicon can be removed with wellknown chemical etchants of a plasma etch. In this example, the widths of the resulting interelectrode gaps 278 are approximately 2.0 microns.

Figure 20G:
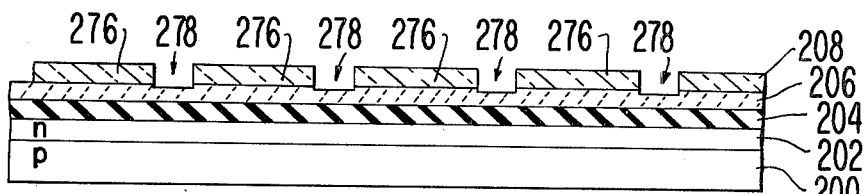
Figure 20H:
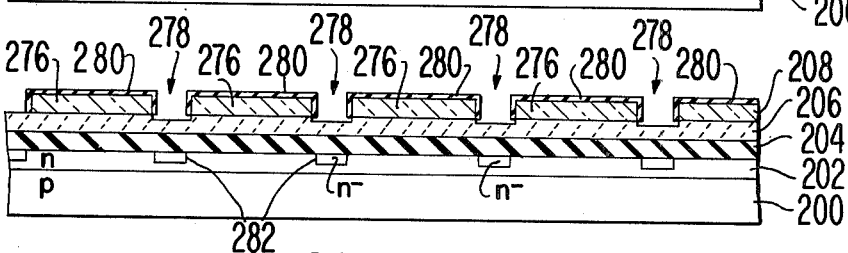

Thereafter, the remaining portion of layers 214, 212 and 210 together with the layers 248 and 250 are removed leaving the structure substantially as shown in FIG. 20g. This figure shows a portion of the insulating layer 206 of silicon nitride lying in registration beneath the first level interelectrode gaps 278 removed. The removal of a portion of the layer 206 follows as a natural consequence of removing the silicon nitride layers 214 and 210. In this example, the thicknesses of the various layers of silicon nitride have been selected such that the removal of the layers 214, 212 and 210 together with the layers 248 and 250 does not completely remove the layer 206 from the interelectrode gap regions. Referring now to FIG. 20h, a passivating layer 280 is formed on the exposed portions of the plurality of first level potential well electrodes 276 as shown. In this example, the passivating layer 280 preferably comprises approximately 3000 Angstroms of thermally grown silicon dioxide (thermox). The passivating layer 280 is grown in such a way that the exposed portions of the layer 206 of silicon nitride are not oxidized to any appreciable extent.

Next, well-known ion implantations techniques are used to form a plurality of n- regions 282 in the $n$ type region 202 in underlying registration with the plurality of first level interelectrode gaps 278. The plurality of first level electrodes 276 together with each electrode's associated layer of thermox function to protectively mask those portions of the $n$ type region 202 that are to remain unaffected by the ion implant. Since this ion implantation step is used to form n- type regions in the existing $n$ type region 202, boron (or other desired $p$ type) ions are used to convert the selected portions of the $n$ type region 202 to n- type implanted barrier regions.

Figure 20I:
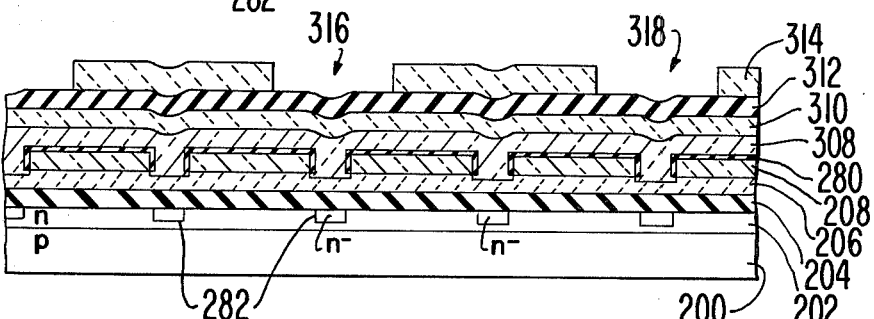

Next, as shown in FIG. 20i, a layer of electrically conductive material 308 (which will subsequently be subdivided using the edge etch technique of the invention to form a plurality of individual second level barrier region electrodes) is formed in the first level interelectrode gaps 278 and on the surface of the insulating thermox layer 280 as shown. In this example, the layer 308 is formed using well-known vapor deposition techniques from polycrystalline silicon which has been highly doped with appropriate impurities to render it conductive and is approximately 4000 Angstroms thick.

Next, a layer 310 of silicon nitride approximately 400 Angstroms thick is formed on the upper surface of the highly doped electrically conductive polycrystalline silicon layer 308.

Next, a 7500 Angstrom thick layer 312 of silicon dioxide is formed on the upper surface of the layer of silicon nitride 310. The layer of silicon dioxide 312 is deposited by well-known chemical vapor deposition techniques.

Next, a layer of silicon nitride 314 approximately 1000 Angstroms thick is formed on the upper surface of the vapox layer 312. The layer of silicon nitride 314 shown in FIG. 20i is provided with a pair of apertures 316 and 318 which expose selected portions of the underlying layer of vapox 312. The apertures 316 and 318 in the layer of silicon nitride 314 are formed by photolithographic definition and etching techniques common to the semiconductor industry. These apertures are centered above alternate first level interelectrode gaps 278, are approximately 4 microns wide and are disposed on 10 micron centers.

Figure 20J:
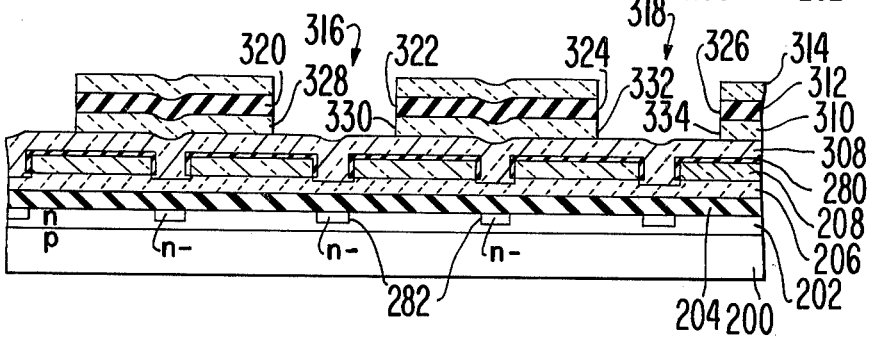

Referring now to FIG. 20j, portions of the vapox layer 312 and the silicon nitride layer 310 lying in registration beneath the apertures 316 and 318 have been removed. The exposed portions of the vapox layer 312 are etched with a buffered hydrofluoric acid solution. The subsequently exposed portions of the silicon nitride layer 310 are etched away with hot phosphoric acid. Care is taken to etch completely through the exposed portions of the silicon nitride layer 310 without completely etching the thicker silicon nitride layer 314. As a result of etching through the silicon dioxide layer 312, lateral edges 320, 322, 324 and 326 are formed. In like manner, etching through the silicon nitride layer 310 forms lateral edges 328, 330, 332 and 334.

Figure 20K:
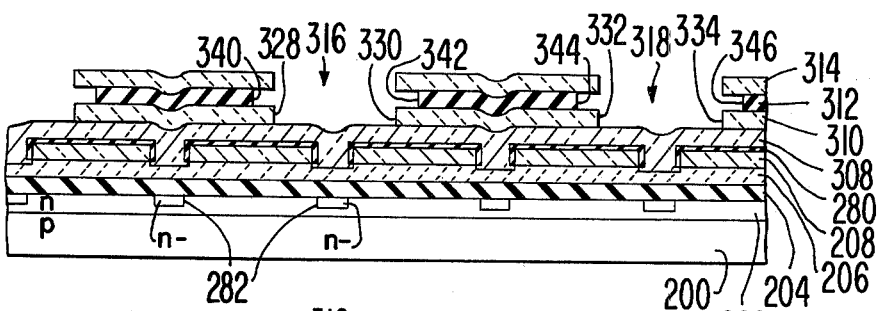

Referring now to FIG. 20k, the exposed lateral edges 320, 322, 324 and 326 on the layer 312 of silicon dioxide (vapox) are etched a selected distance to form new lateral edges 340, 342, 344 and 346 as shown. In this example, the distance between lateral edges 320, 322, 324 and 326 and new lateral edges 340, 342, 344 and 346 respectively is approximately 1 micron.

Figure 20L:
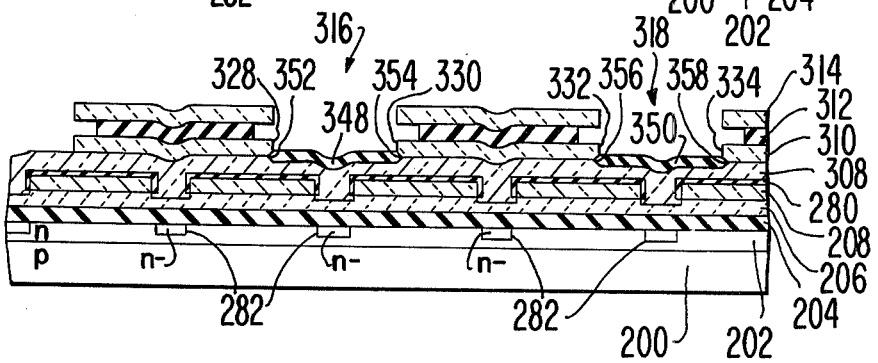

Next, as shown in FIG. 20l, the exposed portions of the electrically conductive layer 308 of highly doped polycrystalline silicon are thermally oxidized to form protective layers 348 and 350 as shown. In this example, these layers of silicon dioxide 348 and 350 are grown to a thickness of approximately 1500 Angstroms. The layers 348 and 350 have lateral edges 352, 354, 356 and 358 which are juxtaposed lateral edges 328, 330 and lateral edges 332, 334 respectively. As noted above, the growth of the thermox layers 348 and 350 does not preclude the etching of those portions of the layer 310 of silicon nitride exposed between the lateral edges 352, 354, 356 and 358 on the layers 348 and 350 and the lateral edges 340, 342, 344 and 346 on the layer 312 of vapox respectively.

Figure 20M:
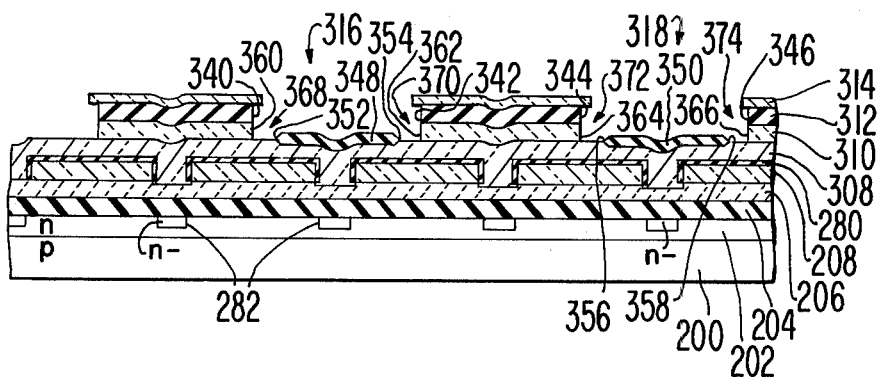
Figure 20N:
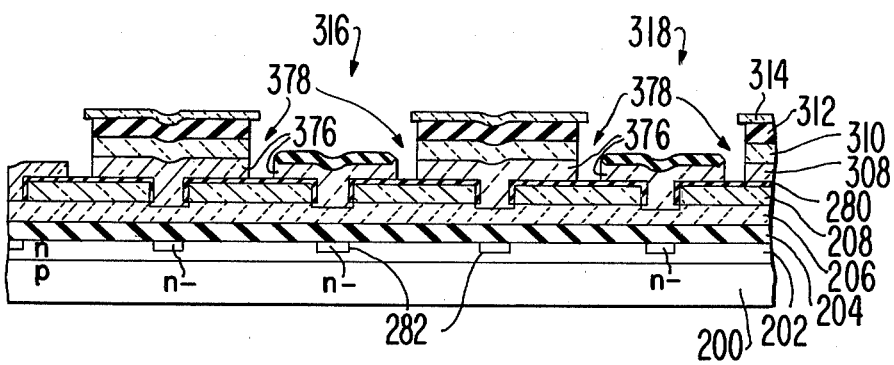
Figure 20O:
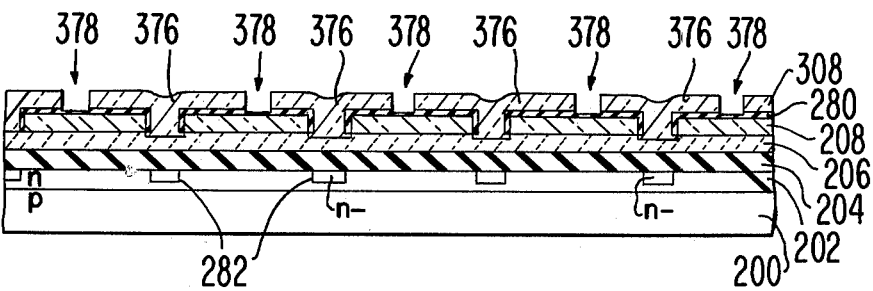

Thereafter, as is shown in FIG. 20m, the exposed lateral edges 328, 330, 332 and 334 on the layer 310 of silicon nitride are etched to form new lateral edges 360, 362, 364 and 366 respectively. The formation of these new lateral edges define narrow openings 368, 370, 372, and 374 to the surface of the layer 308 of highly doped and electrically conductive polycrystalline silicon. The narrow opening 368 is bounded by a pair of lateral edges 360 and 352 as shown. The other simultaneously formed narrow openings are bounded in like manner. The width of these narrow openings are controllable by the location of the lateral edges 340, 342, 344 and 346 and by the type, concentration, time and temperature of the silicon nitride etchant used. In this example, as mentioned above, the lateral edges 340, 342, 344 and 346 on the layer 312 of vapox have been laterally displaced by etching a selected distance of approximately 1 micron. Next, as is shown in FIG. 20n, the exposed portions of the electrically conductive layer 308 of highly doped polycrystalline silicon lying beneath the narrow openings 368, 370, 372 and 374 are etched away exposing portions of the insulating layer 280 of silicon dioxide. This etching step creates a plurality of second level barrier electrodes 376 formed from remaining portions of the electrically conductive layer 308 of highly doped polycrystalline silicon which are isolated from similar adjacent electrodes by a plurality of second level interelectrode gaps 378. It is again to be understood that the exposed portions of the layer 308 of polycrystalline silicon can be removed with well-known liquid chemical etchants or a plasma etch. In this example, the widths of the resulting second level interelectrode gaps 378 are approximately 1 micron. Thereafter, the remaining portions of layers 314, 312 and 310 together with the layers 348 and 350 are removed leaving the structure substantially as shown in FIG. 20o. This figure shows a portion of the passivating layer 280 of the thermox lying in registration beneath the plurality of second level interelectrode gaps 378 removed. The removal of a portion of the layer 280 follows as a natural consequence of removing the silicon dioxide layer 312 together with the layers 348 and 350. The removal of a portion or all of the passivating layer 280 of vapox lying beneath the second level interelectrode gaps 378 is not critical as it will be regrown in the final process step.

Figure 20P:
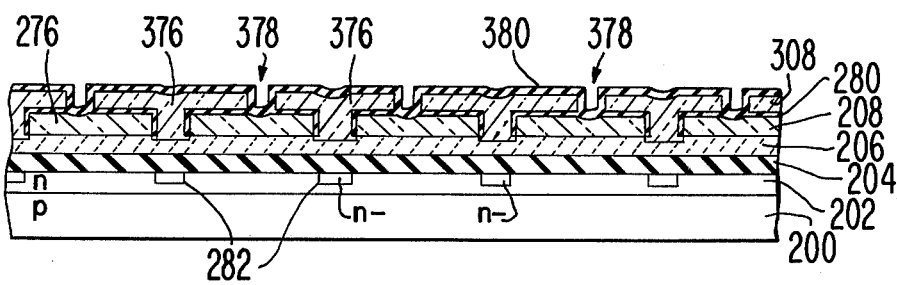

Lastly, as is shown in FIG. 20p, a passivating layer 380 is formed to seal the exposed surfaces of the second level electrodes 376 and the exposed portions of the first level electrodes 276 lying beneath the second level interelectrode gaps 378. In this example, the passivating layer 380 comprises approximately 2000 Angstroms of silicon dioxide (thermox) grown on all exposed polycrystalline silicon surfaces followed by the vapor deposition of approximately 5000 Angstroms of vapox.

The first and second levels of electrodes 276 and 376 are electrically connected as described above for two-phase CCD operation. Those skilled in the art of CCD structure and fabrication will understand that deletion of various portions of the processing steps described in this example can be made to produce devices with substantially different characteristics than those produced with the described process. In particular, elimination of the step used to form the n type buried channel region 202 will result in a surface channel CCD. Additionally, the elimination of the steps used to form the n- type implanted barrier regions 282 will result in the fabrication of a multiphase CCD. Moreover, standard photolithographic definition and etching processes can be used to form either the first or second level interelectrode gaps 278 and 378 respectively, if so desired, with the remaining gap being produced with the edge etch technique of the invention.

MINIMUM GEOMETRY LATERAL ISOLATION

Many ways are known to provide lateral electrical isolation for a plurality of regions of conductive material used in semiconductor devices. Among these ways are appropriately biased PN junctions described in U.S. Pat. No. 3,117,260 issued to Noyce on Jan. 7, 1964. Combinations of pn junctions and zones of intrinsic and extrinsic semiconductor materials can also be employed and are described in U.S. Pat. No. 3,150,299 issued to Noyce on Sept. 22, 1964. Dielectric isolation techniques are taught in U.S. Pat. No. 3,391,023 issued to Frescura on July 2, 1968. Mesa etching to achieve lateral isolation is discussed in U.S. Pat. No. 3,489,961 issued to Frescura, et al, on Jan. 13, 1970. Tucker and Berry in U.S. Pat. No. 3,736,193 issued May 29, 1973 disclose the use of selectively doped polycrystalline silicon to help isolate islands of single crystal silicon in which circuit elements can be formed. U.S. Pat. No. 3,648,125 issued to D. L. Petlzer on Mar. 7, 1972 teaches how a thin silicon epitaxial layer, formed on a silicon substrate, is sub-divided into electrically isolated pockets by a grid of oxidized regions of epitaxial silicon material which extends through the epitaxial layer to a laterally extending pn junction.

In the commercial exploitation of many of the above mentioned isolation techniques, it is necessary to provide openings to the surface of a semiconductor material for use as either etch or diffusion windows. In each of these isolation techniques it is possible, in principle, to use openings with sub-micron geometries and in so doing reduce the overall size of the devices being produced. In practice, however, for reasons given above, it has heretofore not been possible to use such minimum geometry isolation techniques in commercially viable operations.

The advantages available in reducing the width of isolation regions and therefore reducing device size in integrated circuit manufacturing are substantial. First, the cost of processing a single semiconductor wafer depends very little on the number of devices which the wafer contains. Therefore, the cost per device can be reduced by making the devices smaller and therefore having more devices per semiconductor wafer. Second, the yield (number of good devices on a wafer) on semiconductor wafers decreases drastically with increasing device size. This decrease is due primarily to defects which appear in both the semiconductor wafers and to defects which are caused by processing and photomasking steps. Since the cost per device is directly related to yield, it is desirable to minimize device size in order to maximize yield. Third, it is clear that practical limits on device size exist with present integrated circuit manufacturing techniques. Although this limit is becoming larger as technology develops, it has not kept pace with the demands for devices which provide more complex circuit functions on a single structure. A reduction in lateral isolation dimensions will help alleviate this space problem by providing more available active area on a device of a given size, allowing added design flexibility and more complex circuit function within the device size limitations of present day technology.

Two specific examples follow which show utility of the edge etch technique of the invention in providing narrow lateral isolation areas of silicon dioxide in semiconductor devices. Example 3 produces lateral isolation of a polysilicon film via the thermal growth of silicon dioxide beneath a plurality of narrow openings in an overlying layer. Example 4 provides an illustration of the utility of the edge etch technique of the invention in subdivision of a thin silicon epitaxial layer formed on a mono-crystalline silicon substrate to form semiconductor structures such as those taught by Peltzer in the U.S. Patent cited above.

EXAMPLE 3

Figure 21A:
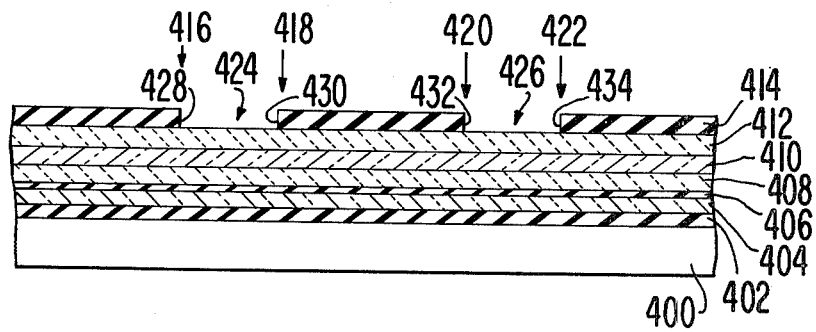

Referring now to FIG. 21a, a substrate 400 is shown in partial cross-section and will be used as the starting material for this example. The substrate 400 comprises a wafer of mono-crystalline silicon about 500 microns thick. Although this example uses a silicon semiconductor substrate, it will be evident to those skilled in the art that other materials of other thicknesses can be used. Furthermore, although unspecified in this example, the semiconductor substrate 400 can be of either p or n type conductivity if so desired depending upon the type of impurity atoms used as dopants.

Next, a layer of insulating material 402 is formed on the upper surface of the substrate 400. In this example, the insulating layer comprises approximately 1200 Angstroms of thermally grown silicon dioxide (thermox). Next, a layer of electrically conductive material 404 is formed on the upper surface of the layer of thermox 402. In this example, the layer 404 is formed using well-known vapor deposition techniques from polycrystalline silicon which has been highly doped with appropriate impurities to render it conductive and is approximately 3000 Angstroms thick. Narrow oxide regions extending from the upper surface of this polysilicon layer to the upper surface of the layer 402 of thermox will subsequently be formed subdividing the layer 404 into laterally isolated regions.

Thereafter, a thin layer 406 of thermox is grown on the upper surface of the layer 404 of doped polycrystalline silicon. This layer is approximately 500 Angstroms thick.

Next, a layer 408 of silicon nitride approximately 1500 Angstroms thick is formed on the upper surface of the thin layer 406 of thermox.

Well-known chemical vapor deposition techniques are employed to form a 3000 Angstrom thick layer 410 of polysilicon on the upper surface of the layer 408. Because this layer of polysilicon will subsequently be completely removed it need not be electrically conductive and hence is not doped with impurity atoms.

Thereafter, a layer 412 of silicon nitride approximately 1000 Angstroms thick is formed on the upper surface of the undoped polycrystalline silicon layer 410.

To complete the initial structure shown in FIG. 21a a 2000 Angstrom thick layer of silicon dioxide 414 is deposited by well-known chemical vapor techniques on the upper surface of the layer of silicon nitride 412. As narrow oxide isolation regions are to be thermally grown in the doped polysilicon layer 404 at a plurality of locations 416, 418, 420 and 422, the vapox layer 414 is provided with apertures 424 and 426 as shown. These apertures are formed by photolithographic definition and etching techniques common to the semiconductor industry. Associated with aperture 424 are two lateral edges 428 and 430. Likewise, aperture 426 has associated with it a pair of lateral edges 432 and 434. These lateral edges are each disposed in overlying registration along a selected edge of a to-be-formed narrow lateral oxide isolation region as will be fully understood from the detailed description hereinbelow.

Figure 21B:
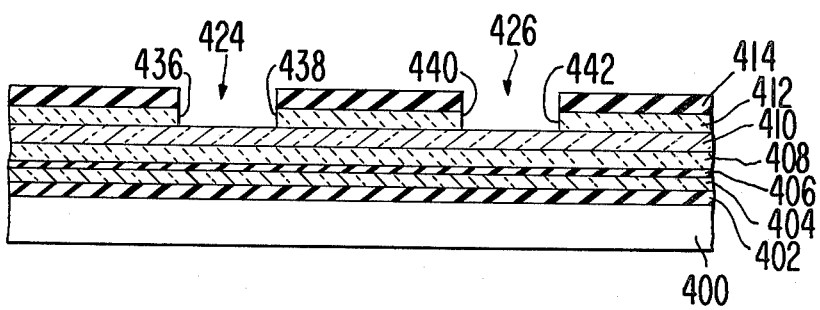

Referring now to FIG. 21b, the exposed portions of the silicon nitride layer 412 lying in registration beneath the apertures 424 and 426 are etched away with hot phosphoric acid. This etching of the silicon nitride layer 412 results in the formation of lateral edges 436, 438, 440 and 442 as shown.

Figure 21C:
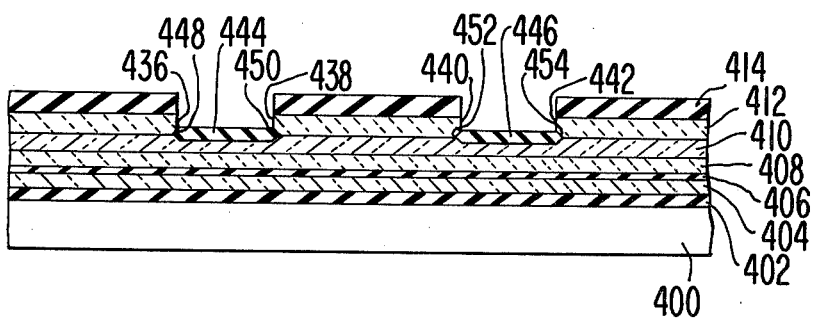

Next, as shown in FIG. 21c, the exposed portions of the layer 410 of undoped polycrystalline silicon are thermally oxidized to form protective layer 444 and 446. In this example, these protective layers of thermox are grown to a thickness of approximately 1500 Angstroms. The layers 444 and 446 have lateral edges 448, 450, 452 and 454 which are juxatoposed the lateral edges 436, 438, 440 and 442 respectively. Again, the growth of the thermox layers 444 and 446 does not preclude the selective etching of the exposed lateral edges 436, 438, 440 and 442 on the layer 412 of silicon nitride.

Figure 21D:
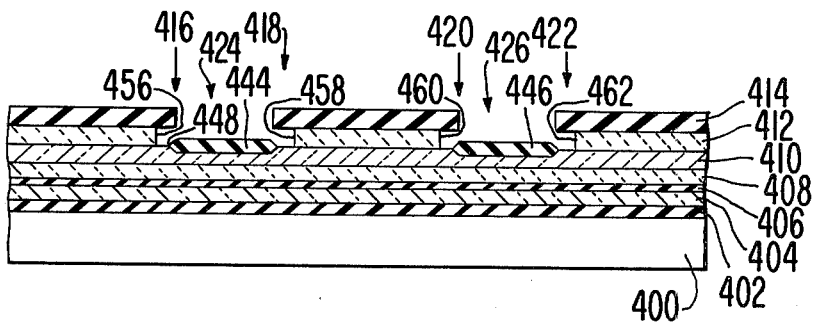

Next, as is shown in FIG. 21d, the exposed lateral edges 436, 438, 440 and 442 on the layer 412 of silicon nitride are etched to form new lateral edges 456, 458, 460 and 462 respectively. The formation of these new lateral edges define narrow openings to the surface of the layer 410 of undoped polycrystalline silicon at the locations 416, 418, 420 and 422 respectively. As can be seen in the figure the narrow opening at the location 416 is bounded by the newly formed lateral edge 456 on the layer 412 of silicon nitride and the lateral edge 448 on the protective layer of thermox 444. The other simultaneously formed narrow openings are similarly bounded. The width of these narrow openings are a function of the degree to which the layer 412 of silicon nitride is laterally etched. In this example, the narrow openings are approximately 0.5 microns wide.

Figure 21E:
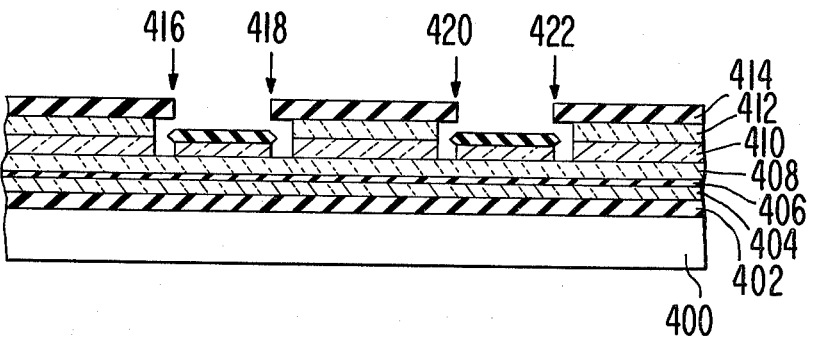
Figure 2I:
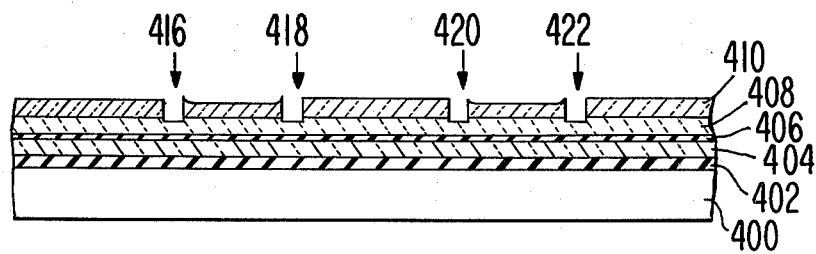
Figure 2I:
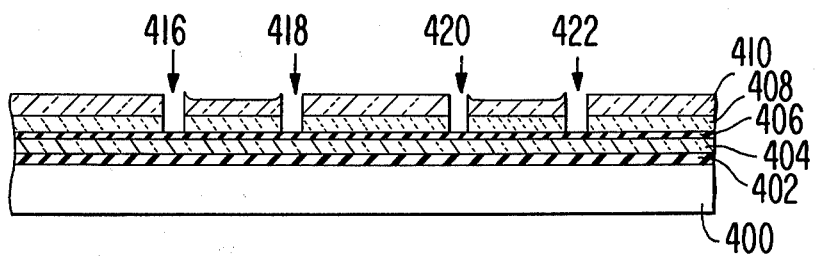
Figure 2I:
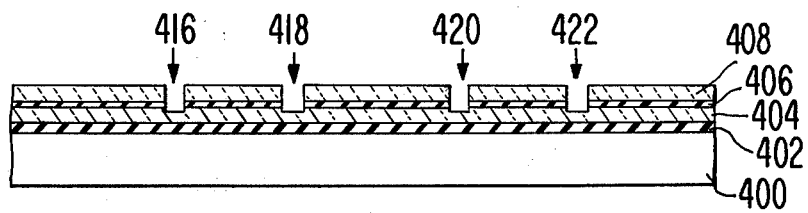
Figure 2I:
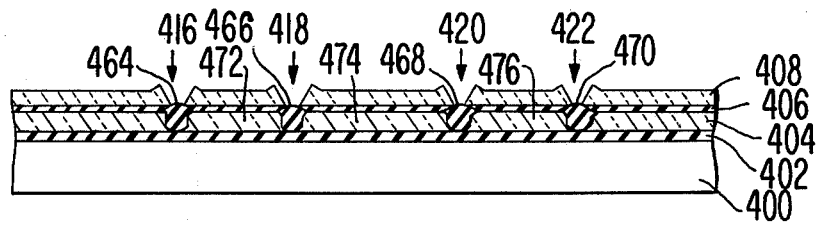
Figure 2I:
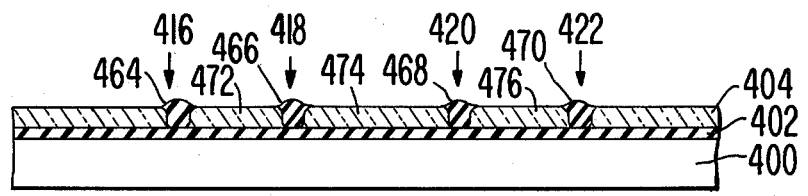

Next, as is shown in FIG. 21e, the exposed portions of the undoped polysilicon layer 410 lying in registration beneath the narrow openings at the locations 416, 418, 420 and 422 are etched away. Thereafter, the remaining portions of the layer of vapox 414, the layer of silicon nitride 412, together with the protective layers of thermox 444 and 446 are removed leaving the structure substantially as shown in FIG. 21f. FIG. 21f shows a portion of the silicon nitride layer 408 lying in registration beneath the narrow openings 416, 418, 420 and 422 removed. The removal of a portion of the layer 408 follows as a natural consequence of removing silicon nitride layer 412. The removal of this portion of layer 408 does not adversely affect the final structure of this process.

Referring now to FIG. 21g, the remaining portions of the exposed silicon nitride layer 408 lying in registration beneath the narrow openings at the locations 416, 418, 420 and 422 are etched away. Having formed narrow openings in the layer 408 of silicon nitride at the locations 416, 418, 420 and 422 the remaining portions of the layer 410 of undoped polycrystalline silicon are removed. The etchant used to remove the remaining portions of the layer 410 does not etch the layer 404 of electrically conductive highly doped polycrystalline silicon because of the presence of the thin layer 406 of thermox. Subsequently, as shown in FIG. 21h, the exposed portions of the thin layer 406 of thermox lying in registration beneath the narrow openings in the layer 408 of silicon nitride at the locations 416, 418, 420 and 422 are etched away. This etching exposes portions of the electrically conductive layer 404 of highly doped polycrystalline silicon. As a rule of thumb, the thermal growth of one unit of silicon dioxide on a silicon surface consumes approximately 0.45 units of silicon material. Therefore, approximately 1000 Angstroms of the exposed surface of the highly doped polysilicon layer 404 are etched away as shown in FIG. 21h. This partial etching of the polysilicon layer is done to provide a more nearly planar surface in the resulting final structure as will be described below.

Next, the exposed portions of the electrically conductive highly-doped polysilicon layer 404 are thermally oxidized forming isolation regions 464, 466, 468 and 470 at the locations 416, 418, 420 and 422 respectively as is shown in FIG. 21i. This step subdivides and laterally electrically isolates selected portions 472, 474 and 476 of the layer 404.

Lastly, the remaining portions of the silicon nitride layer 408 and the thin thermox layer 406 are removed leaving the structure substantially as shown in FIg. 21j. Because of the partial etching in a previous step of a portion of the layer 404, and the removal by etching of the thin thermox layer 406, the oxide isolation regions 464, 466, 468 and 470 protrude only slightly above the upper surface of the layer 404 leaving that surface substantially planar.

Those skilled in the art of semiconductor structure fabrication will understand that deletions of various portions of the processing steps described above can be made to produce structures different from those described. In particular, the step of partially etching the exposed surface of the layer 404 as shown in FIG. 21h may be eliminated with the result of having a step of approximately 3000 Angstroms in the final structure. This step height will not adversely affect the usefulness of this structure in most applications.

EXAMPLE 4

This example of minimum geometry lateral isolation, which both embodies and further illustrates the process and structure of the invention, is provided to show specific applicability of the Edge Etch Technique to the subject matter taught by U.S. Pat. No. 3,648,125 entitled: "Method of Fabricating Integrated Circuits with Oxidized Isolation and the Resulting Structure" issued to Douglas L. Peltzer on Mar. 7, 1972. In this example, a thin silicon epitaxial layer, formed on a silicon substrate is subdivided into electrically isolated pockets by a grid of oxidized regions of epitaxial silicon material (hereafter called "Oxidized Isolation Regions"). These regions are oxidized through the epitaxial layer to a laterally extending isolation pn junction (hereafter called the "Isolation pn Junction").

Figure 22A:
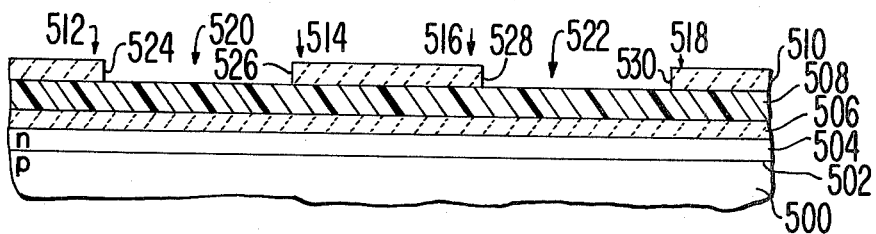
FIGS. 22a through 22g are stylized partial cross-sectional views of structures used to subdivide a thin silicon epitaxial layer into electrically isolated pockets by a grid of oxidized isolation regions of epitaxial silicon material which extend through the epitaxial layer to a laterally extending isolation pn junction using the edge etch technique of the invention.

Referring now to FIG. 22a, a substrate 500 is shown in partial cross section and will be used as the starting material for this example. The substrate 500 comprises a wafer of monocrystalline silicon that has been boron doped with approximately $5 \times 10^{14}$ impurity atoms per cubic centimeter, and hence is of $p$ type conductivity. Next, a thin silicon epitaxial layer 504 approximately 1.25 microns thick is formed on the upper surface of the substrate 500. In this example, the epitaxial layer is doped with approximately $3 \times 10^{16}$ phosphorous impurity atoms per cubic centimeter and hence is of $n$ type conductivity. The metallurgical interface between the epitaxial silicon layer 504 and the underlying silicon substrate 500 is denoted by a line 502. Usually, the resultant isolation pn junction is not coextensive with the metallurgical interface 502. Rather, during the formation of the epitaxial layer, the position of the isolation pn junction is determined by dopant concentrations, diffusion constants, and process parameters. Its ultimate position is also influenced by the subsequent processing of the substrate. However, for purposes of this description, it is assumed that the isolation pn junction is coextensive with the metallurgical interface 502. Moreover, it is to be understood that the substrate 500 can be of opposite conductivity type if the conductivity type of the thin silicon epitaxial layer is also reversed.

Next, a mask layer 506 of silicon nitride is formed on the upper surface of the epitaxial layer 504. The layer 506 is formed using well-known chemical vapor deposition techniques and is approximately 1000 Angstroms thick.

Thereafter, a layer 508 of aluminum oxide is formed on the upper surface of the layer 506. In this example, the layer of aluminum oxide is formed using standard RF sputtering techniques and is approximately 2000 Angstroms thick.

To complete the initial structure shown in FIG. 22a, a 400 Angstrom thick layer 510 of silicon nitride is deposited by wellknown chemical vapor techniques on the upper surface of the layer 508 of aluminum oxide. As narrow oxidized isolation regions are to be thermally grown in the thin silicon epitaxial layer 504 extending downwardly through the isolation pn junction at a plurality of locations 512, 514, 516 and 518, the nitride layer 510 is provided with apertures 520 and 522 as shown. These apertures are formed by photolithographic definition and etching techniques common to the semiconductor industry. Associated with the aperture 520 are two lateral edges 524 and 526. Likewise, the aperture 522 has associated with it a pair of lateral edges 528 and 530. These lateral edges are each disposed in overlying registration along a selected edge of a to-be-formed narrow oxidized isolation region as will be fully understood from the detailed description hereinbelow.

Figure 22B:
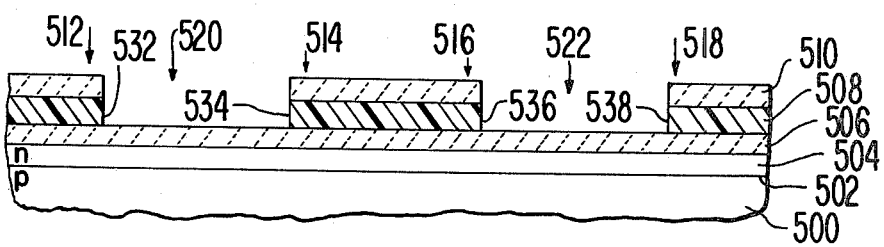

Referring now to FIG. 22b, the exposed portion of the aluminum oxide layer 508 lying in registration beneath the apertures 520 and 522 are etched away. Although other etchants can be successfully employed, one acceptable etchant for aluminum oxide comprises, by volume: 3 parts 49% hydrofluoric acid (electronic grade); 2 parts 70% nitric acid (electronic grade); and 60 parts deionized water. At room temperature (22° C), this solution etches aluminum oxide at a rate of approximately 5 to 10 Angstroms per second. This etching of the aluminum oxide layer 508 results in the formation of lateral edges 532, 534, 536 and 538 as shown.

Figure 22C:
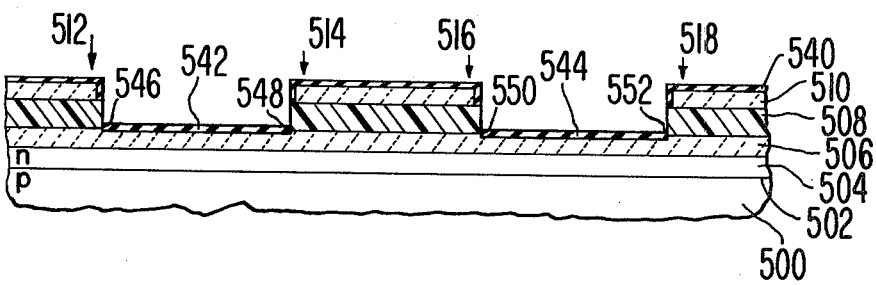

Next, as can be seen by reference to FIG. 22c, a thin layer 540 of silicon dioxide (thermox) is thermally grown on the exposed surfaces of the layer of silicon nitride 510. Simultaneously, the exposed portions of the silicon nitride layer 506 lying in registration beneath the apertures 520 and 522 are thermally oxidized to form protective layers 542 and 544 respectively. In this example, the layers of thermally grown silicon dioxide 540, 542 and 544 are approximately 100 Angstroms thick. As has been noted in previous examples, the 100 Angstrom thickness of silicon dioxide produced on the silicon nitride layer 540 is negligible when compared to the amount of silicon dioxide produced by the same process on polycrystalline silicon (typically 8000 Angstroms). However, this thin layer is sufficient for protecting the silicon nitride layer 540 in the present application.

The layers 542 and 544 have lateral edges, 546, 548, 550 and 552 which are juxtaposed the lateral edges 532, 534, 536 and 538 respectively. It is noted that the characteristics of aluminum oxide do not change to any appreciable extent under the process conditions necessary to form silicon oxide on the surface of silicon nitride. Accordingly, in this example, the growth of the protective thermox layers 542 and 544 does not preclude selective etching of the exposed lateral edges 532, 534, 536 and 538 on the layer 508 of aluminum oxide.

Figure 22D:
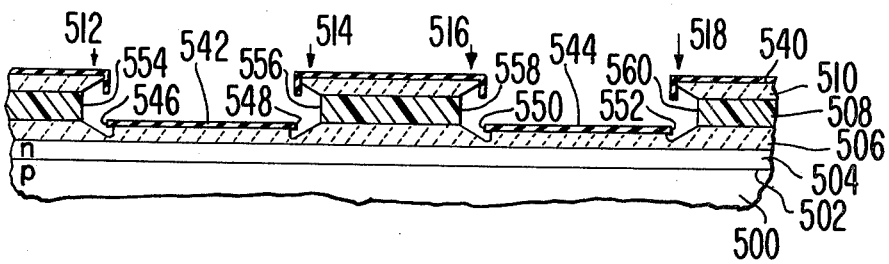
Figure 22E:
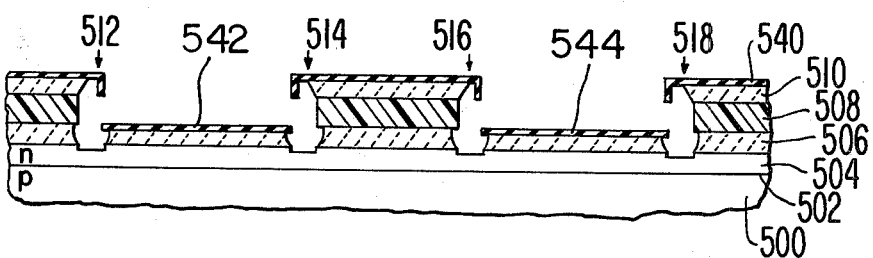

Referring now to FIG. 22d, the exposed lateral edges 532, 534, 536 and 538 on the layer of aluminum oxide are etched to form new lateral edges 554, 556, 558 and 560 respectively. In this example it is assumed that the lateral edges 532, 534, 536 and 538 are etched with hot phosphoric acid. Since this solution also etches silicon nitride (but at a slower etch rate), the exposed edges of silicon nitride layers 506 and 510 are shown as also being etched in FIG. 22d. The formation of the new lateral edges 554, 556, 558 and 560 defines narrow openings to the layer 506 of silicon nitride at the locations 512, 514, 516 and 518 respectively. As can be seen in the figure, the narrow opening at the location 512 is bounded by the newly formed lateral edge 554 on the layer 508 of aluminum oxide and the lateral edge 546 on the protective layer 542 of thermox. The other simultaneously formed narrow openings are similarly bounded. The widths of these narrow openings are a function of the degree to which the layer 508 of aluminum oxide is laterally etched. In this example, the narrow openings are approximately 1.5 microns wide. Next, as is shown in FIG. 22e, the exposed portions of the silicon nitride layer 506 lying in registration beneath the narrow openings at the locations 512, 514, 516 and 518 are removed by plasma etching.

Figure 22F:
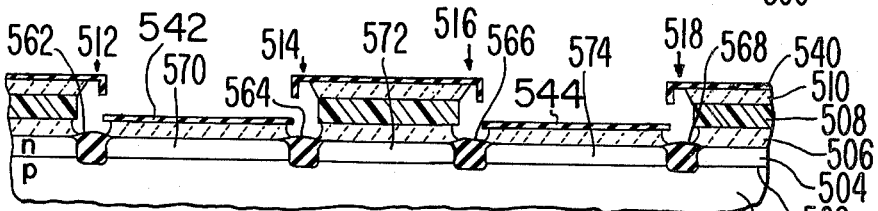

As a rule of thumb, the thermal growth of one unit of silicon dioxide on a silicon surface consumes approximately 0.45 units of silicon material. Therefore, to provide for a more nearly planar surface in the resulting final structure, approximately 0.7 microns of the thin silicon epitaxial layer 504 lying exposed in registration beneath the narrow openings in the layer 506 of silicon nitride at the locations 512, 514, 516 and 518 are etched away. Next, the exposed portions of the thin silicon epitaxial layer 504 are thermally oxidized forming oxidized isolation regions 562, 564, 566 and 568 at the locations 512, 514, 516 and 518 respectively as is shown in FIG. 22f. It is to be noted that the oxidized isolation regions 562, 564, 566 and 568 extend downwardly past the isolation pn junction which for purposes of this description is assumed to be at the same location as the metallurgical interface 502. This step subdivides and laterally electrically isolates pockets of epitaxial silicon material 570, 572 and 574. Each such pocket of epitaxial silicon is isolated by a portion of the isolation pn junction and portions of the oxidized isolation regions. Moreover, each such pocket can contain active devices, passive devices, or both. Cross-under regions of low resistivity can be formed in the substrate to interconnect regions separated by at least one oxidized isolation region.

Figure 22G:
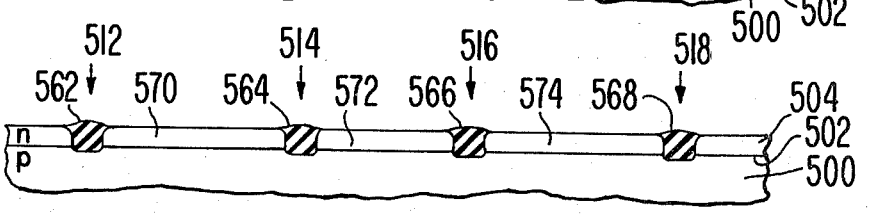

Lastly, the remaining portions of the thermox layers 540, 542 and 544 together with the aluminum oxide layer 508 and the silicon nitride layers 510 and 506 are removed leaving the structure substantially as shown in FIG. 22g. The top surfaces of the thin silicon epitaxial layer 504 and the oxidized isolation regions 562, 564, 566 and 568 are substantially co-planar, thereby reducing undesirable elevation variances or "steps".

EXAMPLE 5

In the fabrication of integrated circuits, one device requirement is to provide interconnections between various individual circuit elements. Such interconnections are usually made by employing a metalization layer. This layer may comprise, for example, such materials as gold, aluminum, or polycrystalline silicon. In semiconductor devices manufactured with present day technology, a significant portion of the space required for such metalization patterns is taken up by the spacing between metal lines. In many device applications it is possible, in principle, to make these metal interconnect lines with spacings between them of approximately 1 micron without degradation of device performance. In practice, however, it has heretofore not been possible to use such minimum geometry metalization gaps in commercially viable devices. The reason for this is because of the difficulties in producing such narrow geometry openings in the metalization layer. As noted above, it is possible to produce narrow openings using electron beam lithography, X-ray lithography or shadowing techniques. However, again as outlined in more detail above, these methods suffer from the drawback of requiring equipment and processes not commonly used or readily available to the solid state electronics industry.

The advantages to be realized from a reduction in spacing between metalization lines and the attendant reduction in overall device size in integrated circuit manufacturing are substantial. First, the cost of processing a single semiconductor wafer depends very litte on the number of devices which the wafer contains. Therefore, the cost per device can be reduced by making the devices smaller and therefore having more devices per semiconductor wafer. Second, the yield (number of good devices on a wafer) on semiconductor wafers decreases drastically with increasing device size. This decrease is due primarily to defects which appear in both the semiconductor wafers and to defects which are caused by processing and photo masking steps. Since the cost per device is directly related to yield, it is desirable to minimize device size in order to maximize yield. Third, it is clear that practical limits on device size exist with present integrated circuit manufacturing techniques. Although this limit is becoming larger as technology develops, it has not kept pace with the demands for devices which provide more complex circuit functions on a single structure. A reduction in spacing required between metalization lines will allow for closer spacing of active device components which will result in greater design flexibility and more complex circuit functions within device size limitations of present technology.

In this example, a process is described for producing narrow gaps in a metalization layer using the edge etch technique of the invention. These narrow gaps electrically isolate the resulting metal interconnection lines from one another. In addition to the many advantages associated with providing smaller geometries for existing integrated circuits, other applications of a minimum geometry metalization gap structure can be envisioned. For example, in high frequency integrated circuit applications, one important design consideration is the reduction of electrical coupling between adjacent metalization lines. By using the narrow metalization gaps produced with the edge etch technique of the invention, it is possible to provide a metal ground plane between active metalization lines without using any more device area than is used for the gap between the metal conductors on present devices.

Although this example relates to semiconductor integrated circuit manufacturing, it will be understood by those skilled in the art that there are other alternate application areas. For instance, the process of this example can be applied to patterning printed circuit boards with higher packing density than presently available.

Figure 23A:
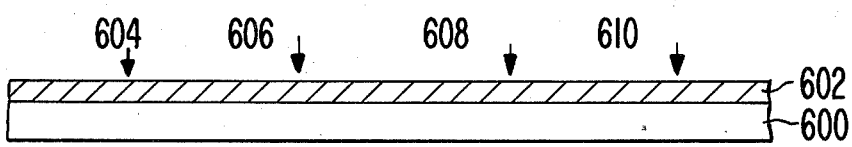
FIGS. 23a through 23h are stylized partial cross-sectional views of structures used to subdivide with narrow gaps a metalization layer using the edge etch technique of the invention.

Referring now to FIG. 23a, a semiconductor body 600 is shown in partial cross-section and will be used as the starting material for this example. The semiconductor body 600 comprises a wafer of mono-crystalline silicon on which all of the steps necessary to produce a useful integrated circuit device have been performed up to the step of supplying metal interconnects between individual circuit components. Therefore, much of the upper surface of the semiconductor body 600 is covered with an insulating layer of silicon dioxide which is provided with a plurality of windows through which electrical connection can be made to selected underlying individual circuit components. This electrical connection is made by adherently forming an electrically conductive layer 602 on the upper surface of the semiconductor body 600. In this example, the layer 602 comprises approximately 8000 Angstroms of gold which has been deposited using well-known evaporation techniques.

Figure 23B:
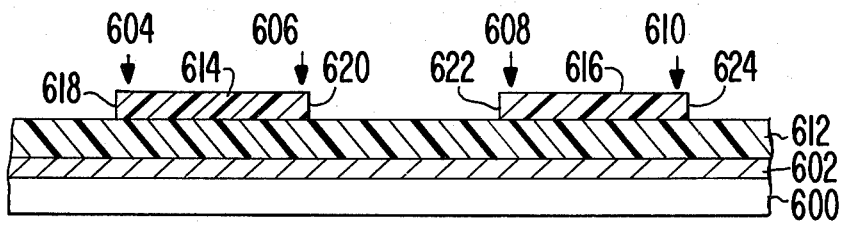

Next, as shown in FIG. 23b, a layer 612 comprising a polyimide enamel such as Pyre M. L. (registered Trademark of E. I. Du Pont De Nemours and Company) is formed on the upper surface of the gold layer 602. In this example, the polyimide layer 612 is approximately one micron thick. A decided advantage of using this material for this layer is that it may be applied and prepared for use without requiring temperatures in excess of approximately 250° C.

Next, a plurality of masks 614 and 616 are formed on the upper surface of the polyimide layer 612. In this example, the masks 614 and 616 are formed from a 0.75 micron thick layer of photoresist which has been photolithographically defined and subsequently etched. Associated with the mask 614 of photoresist are two lateral edges 618 and 620. Likewise, the mask 616 has associated with it a pair of lateral edges 622 and 624. These lateral edges are each disposed in overlying registration along a selected edge of a to-be-formed narrow gap in the underlying gold layer 602 at locations 604, 606, 608 annd 610 as will be fully understood from the detailed description hereinbelow.

Figure 23C:
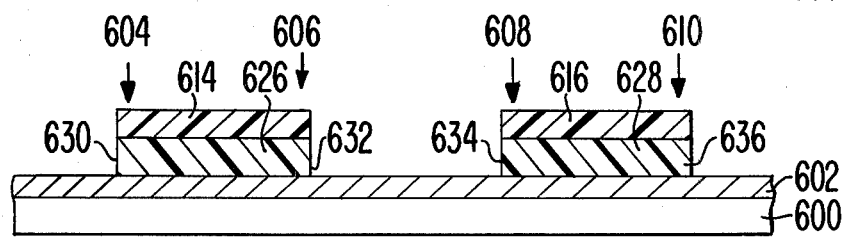

Referring now to FIG. 23c, the exposed portions of the polyimide enamel layer 612 are etched away with hydrazine exposing portions of the layer 602 of gold. This etching process results in the formation of lateral edges 630, 632, 634 and 636 disposed along and below the lateral edges 618, 620, 622 and 624 respectively on the photoresist masks 614 and 616.

Figure 23D:
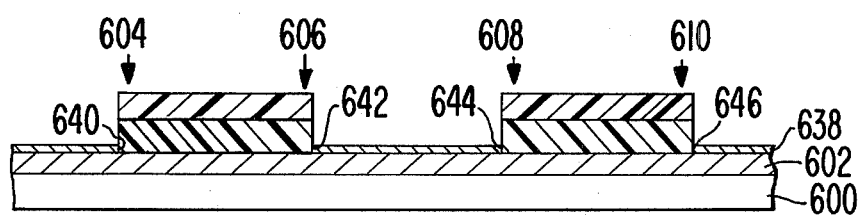

Next, as can be seen by referenced FIG. 23d, a thin layer 638 of nickel is electrolytically deposited on the exposed portions of the layer 602 of gold. In this example, the layer of nickel is approximately 3000 Angstroms thick. Alternatively, the layer of nickel may be deposited by vacuum evaporation techniques common to the semiconductor industry. In this case, it is essential that the nickel layer 638 be discontinued over the step between the exposed portions of the gold layer 602 and the upper surfaces of mask regions 614 and 616. The layer of nickel 638 has lateral edges 640, 642, 644 and 646 juxtaposed lateral edges 630, 632, 634 and 636 respectively on the remaining portion of the polyimide layer 612.

Figure 23E:
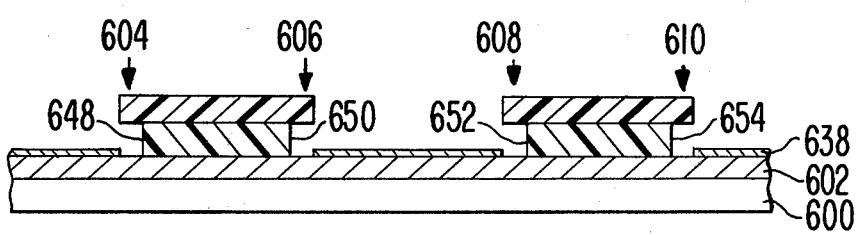

Next, as shown in FIG. 23e, the exposed lateral edges 630, 632, 634 and 636 on the layer 612 of polyimide enamel are etched to form new lateral edges 648, 650, 652 and 654 respectively. The formation of these new lateral edges defines narrow openings to the surface of the layer 602 of gold at the locations 604, 606, 608 and 610 respectively. As can be seen in FIG. 23e, the narrow opening at the location 604 is bounded by the newly formed lateral edge 648 on the layer 612 of polyimide enamel and the lateral edge 640 on the layer of nickel 638. The other simultaneously formed narrow openings are similarly bounded. The width of the narrow openings are a function of the degree to which the layer 612 of polyimide enamel is laterally etched. In this example, the narrow openings are approximately 2.0 microns wide.

Figure 23F:
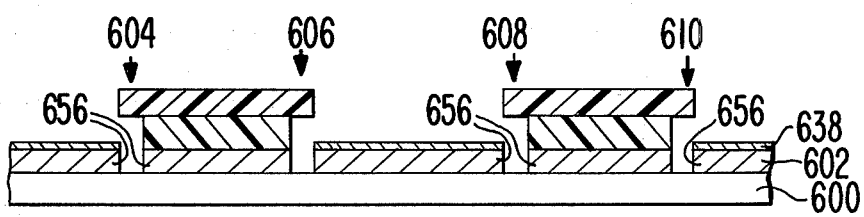

Thereafter, as shown in FIG. 23f the exposed portions of the layer 602 of gold lying in registration beneath the narrow openings at the locations 604, 606, 608 and 610 are removed with a cyanide etching solution to form a plurality of individual electrical conductors 656 separated by narrow gaps. In this example, the narrow gaps are approximately 2.0 microns wide.

Figure 23G:
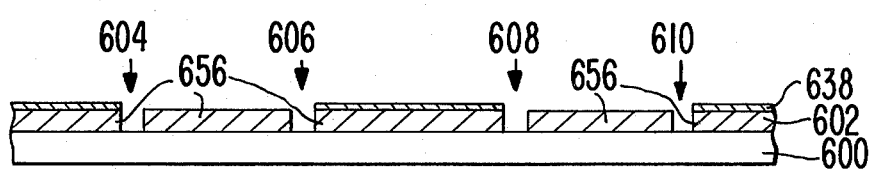
Figure 23H:
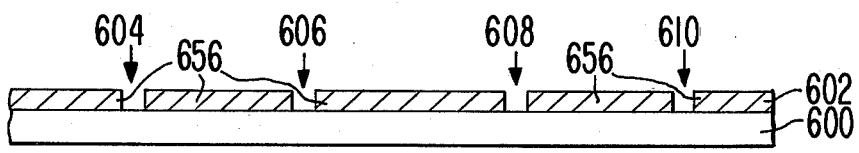

Next, the remaining portion of the polyimide enamel layer 612 together with the photoresist masks 614 and 616 are removed leaving the structure substantially as shown in FIG. 23g. If so desired, the nickel layer 638 can also be removed leaving the structure substantially as shown in FIG. 23h. These final structures provide a plurality of individual electrical conductors separated by narrow gaps.

From the foregoing detailed description it will be evident that there are a number of changes, adaptations and modifications of the present invention which come within the province of those skilled in the art; however, it is intended that all such variations not departing from the spirit of the invention be considered as within the scope thereof as limited solely by the appended claims.

I claim:

1. A planar process for producing a charge-coupled device of the type having a single level of electrodes separated from one another by narrow gaps comprising the steps of:
   a. forming an electrically insulating layer on a substantially planar surface of a semiconductor substrate;
   b. forming an electrically conductive layer on the upper surface of said electrically insulating layer;
   c. forming a plurality of narrow interelectrode gaps in said electrically conductive layer, each interelectrode gap being formed by a process comprising the steps of;
      i. forming on a portion of said electrically conductive layer an etchable mask having a first narrow-opening-forming lateral edge disposed along a selected edge of the to-be-formed interelectrode gap;
      ii. forming a protective layer of a material possessing a set of etch characteristics different from etch characteristics of said electrically conductive layer on the adjacent exposed surface of said electrically conductive layer, said protective layer being formed at a thickness substantially less than the thickness of said etchable mask and with a second narrow-opening-forming lateral edge contiguous to and juxtaposed said first narrow-opening-forming lateral edge;
      iii. etching said first narrow-opening-forming lateral edge on said mask to expose an unprotected portion of said electrically conductive layer to produce a narrow opening to the surface of said electrically conductive layer; and,
      iv. etching said electrically conductive layer through said narrow opening and down to said electrically insulating layer to thereby form one of said narrow interelectrode gaps.

2. The planar process of claim 1 wherein said electrically conductive layer comprises doped polycrystalline silicon.

* * * * *